(12) United States Patent
Ishizu et al.

(10) Patent No.: US 11,935,899 B2
(45) Date of Patent: Mar. 19, 2024

(54) SEMICONDUCTOR DEVICE

(71) Applicant: SEMICONDUCTOR ENERGY LABORATORY CO., LTD., Atsugi (JP)

(72) Inventors: Takahiko Ishizu, Kanagawa (JP); Seiichi Yoneda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 616 days.

(21) Appl. No.: 17/047,740

(22) PCT Filed: Apr. 8, 2019

(86) PCT No.: PCT/IB2019/052859
§ 371 (c)(1),
(2) Date: Oct. 15, 2020

(87) PCT Pub. No.: WO2019/202431
PCT Pub. Date: Oct. 24, 2019

(65) Prior Publication Data
US 2021/0167095 A1 Jun. 3, 2021

(30) Foreign Application Priority Data

Apr. 20, 2018 (JP) .................. 2018-081075
Apr. 27, 2018 (JP) .................. 2018-085916

(51) Int. Cl.
*H03K 19/00* (2006.01)
*H01L 27/12* (2006.01)
(Continued)

(52) U.S. Cl.
CPC ........ *H01L 27/124* (2013.01); *H01L 27/1259* (2013.01); *H01L 29/24* (2013.01);
(Continued)

(58) Field of Classification Search
CPC ................. H03K 19/017; H03K 19/20; H03K 19/00315; G11C 19/28; G09G 2310/0286
See application file for complete search history.

(56) References Cited

U.S. PATENT DOCUMENTS 4,647,798 A * 3/1987 Crafts ................ H03K 19/0948
326/89
5,966,044 A * 10/1999 Naka ................ H03K 19/01721
327/535

(Continued)

FOREIGN PATENT DOCUMENTS

DE          19622646       12/1996
JP          09-055652 A    2/1997
(Continued)

OTHER PUBLICATIONS

International Search Report (Application No. PCT/IB2019/052859) dated Jul. 16, 2019.
(Continued)

*Primary Examiner* — Tuan T Lam
(74) *Attorney, Agent, or Firm* — Fish & Richardson P.C.

(57) ABSTRACT

A semiconductor device capable of stable operation with low power consumption is provided. A logic circuit having a circuit configuration using a transistor including an oxide semiconductor in a channel formation region is included. The logic circuit is a two-input/two-output two-wire logic circuit. Transistors included in the logic circuit each include a gate and a back gate. An input terminal is electrically connected to one of a gate and a back gate of a transistor electrically connected to a wiring for supplying a high power supply potential. An output terminal is connected to the other of the gate and the back gate of the transistor electrically connected to the wiring for supplying a high power supply potential. An output terminal is electrically connected to one of a source and a drain of a transistor (Continued)

electrically connected to a wiring for supplying a low power supply potential. A gate or a back gate of the transistor electrically connected to the wiring for supplying a low power supply potential is electrically connected to an input terminal.

4 Claims, 24 Drawing Sheets

(51) Int. Cl.
    *H01L 29/24*     (2006.01)
    *H03K 19/003*     (2006.01)
    *H03K 19/017*     (2006.01)
    *H03K 19/094*     (2006.01)
    *H03K 19/20*     (2006.01)

(52) U.S. Cl.
    CPC ..... *H03K 19/00315* (2013.01); *H03K 19/017* (2013.01); *H03K 19/0941* (2013.01); *H03K 19/20* (2013.01)

(56) References Cited

U.S. PATENT DOCUMENTS

| | | | |
|---|---|---|---|
| 6,177,811 B1 | 1/2001 | Fuse et al. | |
| 6,566,930 B1* | 5/2003 | Sato | H03K 3/012 327/333 |
| 6,703,863 B2* | 3/2004 | Gion | H03K 3/012 326/62 |
| 6,960,953 B2 | 11/2005 | Ichihara | |
| 8,289,052 B2 | 10/2012 | Kawae | |
| 8,710,762 B2 | 4/2014 | Takahashi et al. | |
| 8,786,313 B2 | 7/2014 | Kawae | |
| 8,957,889 B2 | 2/2015 | Miyake | |
| 8,975,709 B2 | 3/2015 | Miyake | |
| 9,024,317 B2 | 5/2015 | Endo et al. | |
| 2003/0160639 A1 | 8/2003 | Saito et al. | |
| 2011/0084731 A1 | 4/2011 | Kawae | |
| 2015/0263731 A1* | 9/2015 | Kushiyama | H03K 19/017 327/333 |
| 2022/0321006 A1* | 10/2022 | Inoue | H02H 7/18 |
| 2023/0067352 A1* | 3/2023 | Ohshima | H01L 27/0688 |

FOREIGN PATENT DOCUMENTS

| | | |
|---|---|---|
| JP | 10-004196 A | 1/1998 |
| JP | 2004-354970 A | 12/2004 |

OTHER PUBLICATIONS

Written Opinion (Application No. PCT/IB2019/052859) dated Jul. 16, 2019.

* cited by examiner

5700

5800

5900

6000

SEMICONDUCTOR DEVICE

CROSS REFERENCE TO RELATED APPLICATIONS

This application is a U.S. National Phase Application under 35 U.S.C. § 371 of International Application PCT/M2019/052859, filed on Apr. 8, 2019, which is incorporated by reference and claims the benefit of foreign priority applications filed in Japan on Apr. 20, 2018, as Application No. 2018-081075 and on Apr. 27, 2018, as Application No. 2018-085916.

TECHNICAL FIELD

One embodiment of the present invention relates to a semiconductor device.

Another embodiment of the present invention relates to a semiconductor device. Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. A display device, a light-emitting device, a memory device, an electro-optical device, a power storage device, a control system, a semiconductor circuit, and an electronic device include a semiconductor device in some cases.

BACKGROUND ART

A transistor whose channel formation region includes a metal oxide (also referred to as an oxide semiconductor) (OS transistor) has an extremely low leakage current that flows in an off state (off-state current), and thus is expected to be applied to a logic circuit for low power consumption. For example, a single-polarity inverter circuit composed of n-channel OS transistors is proposed in Patent Document 1.

REFERENCE

Patent Document

[Patent Document 1] Specification of United States Patent Application Publication No. 2011/84731

SUMMARY OF THE INVENTION

Problems to be Solved by the Invention

In the case where a logic circuit is composed of only n-channel transistors, a problem of a drop of the amount of threshold voltage in an output voltage arises. In addition, since a shoot-through current flows between power supply lines, a problem of an increase in power consumption arises.

Furthermore, in the case of a transistor whose channel formation region includes silicon (Si transistor), electrical characteristics of a transistor included in a logic circuit change when the transistor is exposed to high temperatures. The change in the electrical characteristics leads to a decrease in the on/off ratio of the transistor, which causes a problem in that normal circuit operation cannot be maintained.

In view of the above problems, an object of one embodiment of the present invention is to provide a highly reliable semiconductor device. Another object of one embodiment of the present invention is to provide a semiconductor device excellent in reducing power consumption.

Note that the description of these objects does not preclude the existence of other objects. One embodiment of the present invention does not have to achieve all these objects. Objects other than these will be apparent from the descriptions of the specification, the drawings, the claims, and the like, and objects other than these can be derived from the descriptions of the specification, the drawings, the claims, and the like.

Means for Solving the Problems

One embodiment of the present invention is a semiconductor device including a first input terminal and a second input terminal, a first output terminal and a second output terminal, a first wiring and a second wiring, and first to fourth transistors. One of a source and a drain of the first transistor is electrically connected to the first wiring, one of a gate and a back gate is electrically connected to the first input terminal, and the other of the source and the drain and the other of the gate and the back gate are electrically connected to the second output terminal; one of a source and a drain of the second transistor is electrically connected to the first wiring, one of a gate and a back gate is electrically connected to the second input terminal, and the other of the source and the drain and the other of the gate and the back gate are electrically connected to the first output terminal; a gate and a back gate of the third transistor are electrically connected to the first input terminal, one of a source and a drain is electrically connected to the first output terminal, and the other of the source and the drain is electrically connected to the second wiring; and a gate and a back gate of the fourth transistor are electrically connected to the second input terminal, one of a source and a drain is electrically connected to the second output terminal, and the other of the source and the drain is electrically connected to the second wiring.

One embodiment of the present invention is a semiconductor device including a first input terminal and a second input terminal, a first output terminal and a second output terminal, a first wiring to a third wiring, and first to eighth transistors. One of a source and a drain of the first transistor is electrically connected to the first wiring, one of a gate and a back gate is electrically connected to the first input terminal, and the other of the source and the drain and the other of the gate and the back gate are electrically connected to a gate and a back gate of the second transistor; one of a source and a drain of the second transistor is electrically connected to the second wiring and the other of the source and the drain is electrically connected to the second output terminal; one of a source and a drain of the third transistor is electrically connected to the first wiring, one of a gate and a back gate is electrically connected to the second input terminal, and the other of the source and the drain and the other of the gate and the back gate are electrically connected to a gate and a back gate of the fourth transistor; one of a source and a drain of the fourth transistor is electrically connected to the second wiring and the other of the source and the drain is electrically connected to the first output terminal; a gate and a back gate of the fifth transistor are electrically connected to the first input terminal, one of a source and a drain is electrically connected to the gate and the back gate of the fourth transistor, and the other of the source and the drain is electrically connected to the third wiring; a gate and a back gate of the sixth transistor are electrically connected to the first input terminal, one of a source and a drain is electrically connected to the first output terminal, and the other of the source and the drain is electrically connected to the third wiring; a gate and a back gate of the seventh transistor are electrically connected to the second input terminal, one of a source and a drain is electrically connected to the gate and the back gate of the second transistor, and the other of the source and the drain is electrically connected to the third wiring; and a gate and a back gate of the eighth transistor are electrically connected to the second input terminal, one of a source and a drain is electrically connected to the second output terminal, and the other of the source and the drain is electrically connected to the third wiring.

In one embodiment of the present invention, the semiconductor device in which a first potential supplied to the first wiring is higher than a second potential supplied to the second wiring is preferable.

In one embodiment of the present invention, the semiconductor device in which the first to fourth transistors are each a transistor including a metal oxide in a channel formation region is preferable.

In one embodiment of the present invention, the semiconductor device in which the first to eighth transistors are each a transistor including a metal oxide in a channel formation region is preferable.

In one embodiment of the present invention, the semiconductor device in which the metal oxide contains at least one of In (indium) or Zn (zinc) is preferable.

In one embodiment of the present invention, the semiconductor device in which the metal oxide contains Ga (gallium) is preferable.

One embodiment of the present invention is a semiconductor device including a plurality of switch circuits and a plurality of logic circuits; each logic circuit includes a first input terminal and a second input terminal, a first output terminal and a second output terminal, a first wiring to a third wiring, and first to eighth transistors. One of a source and a drain of the first transistor is electrically connected to the first wiring, one of a gate and a back gate is electrically connected to the first input terminal, and the other of the source and the drain and the other of the gate and the back gate are electrically connected to a gate and a back gate of the second transistor; one of a source and a drain of the second transistor is electrically connected to the second wiring and the other of the source and the drain is electrically connected to the second output terminal; one of a source and a drain of the third transistor is electrically connected to the first wiring, one of a gate and a back gate is electrically connected to the second input terminal, and the other of the source and the drain and the other of the gate and the back gate are electrically connected to a gate and a back gate of the fourth transistor; one of a source and a drain of the fourth transistor is electrically connected to the second wiring and the other of the source and the drain is electrically connected to the first output terminal; a gate and a back gate of the fifth transistor are electrically connected to the first input terminal, one of a source and a drain is electrically connected to the gate and the back gate of the fourth transistor, and the other of the source and the drain is electrically connected to the third wiring; a gate and a back gate of the sixth transistor are electrically connected to the first input terminal, one of a source and a drain is electrically connected to the first output terminal, and the other of the source and the drain is electrically connected to the third wiring; a gate and a back gate of the seventh transistor are electrically connected to the second input terminal, one of a source and a drain is electrically connected to the gate and the back gate of the second transistor, and the other of the source and the drain is electrically connected to the third wiring; and a gate and a back gate of the eighth transistor are electrically connected to the second input terminal, one of a source and a drain is electrically connected to the second output terminal, and the other of the source and the drain is electrically connected to the third wiring.

In one embodiment of the present invention, the semiconductor device in which a first potential supplied to the first wiring is higher than a second potential supplied to the second wiring is preferable.

In one embodiment of the present invention, the semiconductor device in which the first to eighth transistors are each a transistor including a metal oxide in a channel formation region is preferable.

In one embodiment of the present invention, the semiconductor device in which the switch circuit includes a transistor; and the transistor is a transistor including a metal oxide in a channel formation region is preferable.

In one embodiment of the present invention, the semiconductor device in which any one of the plurality of switch circuits has a function of retaining a potential corresponding to data retained in the logic circuit when brought into an off state is preferable.

In one embodiment of the present invention, the semiconductor device in which the metal oxide contains at least In (indium) or Zn (zinc) is preferable.

In one embodiment of the present invention, the semiconductor device in which the metal oxide contains Ga (gallium) is preferable.

Note that other embodiments of the present invention will be shown in the description of the following embodiments and the drawings.

Effect of the Invention

One embodiment of the present invention can provide a highly reliable semiconductor device. One embodiment of the present invention can provide a semiconductor device excellent in reducing power consumption.

Note that other embodiments of the present invention will be shown in the description of the following embodiments and the drawings.

MODE FOR CARRYING OUT THE INVENTION

Figure 1A:
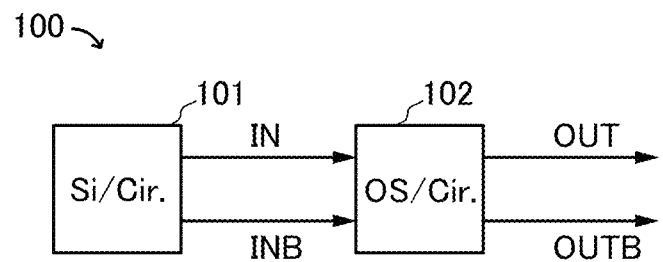
FIG. 1 (A) A block diagram and (B) a circuit diagram that illustrate a configuration example of a semiconductor device.

Hereinafter, embodiments will be described with reference to the drawings. Note that the embodiments can be implemented with many different modes, and it is readily appreciated by those skilled in the art that modes and details can be changed in various ways without departing from the spirit and scope of the present invention. Thus, the present invention should not be interpreted as being limited to the following description of the embodiments.

Note that ordinal numbers such as "first", "second", and "third" in this specification and the like are used in order to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, in the case where a metal oxide has at least one of an amplifying function, a rectifying function, and a switching function, the metal oxide can be called a metal oxide semiconductor. In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Embodiment 1

A configuration of a semiconductor device of one embodiment of the present invention is described.

FIG. 1(A) is a block diagram of a semiconductor device of this embodiment. A semiconductor device 100 described in this embodiment can be roughly divided into a signal generation circuit 101 and a logic circuit 102.

Note that in this specification and the like, a semiconductor device generally means a device that can function by utilizing semiconductor characteristics. Thus, the signal generation circuit 101 and the logic circuit 102 are each referred to as a semiconductor device in some cases.

The signal generation circuit 101 has a function of outputting an input signal and an inverted input signal from a terminal IN and a terminal INB. The signal generation circuit 101 includes a circuit composed of Si transistors (denoted by Si/Cir.). When appropriately designed using a sequential circuit and a combinational circuit with the use of a CMOS circuit, the signal generation circuit 101 can be configured.

The logic circuit 102 includes a circuit composed of OS transistors (denoted by OS/Cir.). The logic circuit 102 is a combinational circuit. An example is an inverter circuit (also referred to as a NOT circuit). The logic circuit 102 has a function of outputting an output signal and an inverted output signal from a terminal OUT and a terminal OUTB in accordance with the input signal and the inverted output signal.

The logic circuit 102 is a two-wire combinational circuit composed of OS transistors. Unlike a Si transistor, an OS transistor has a small change in electrical characteristics in a high-temperature environment. Therefore, highly reliable operation can be performed even in a high-temperature environment.

Figure 1B:
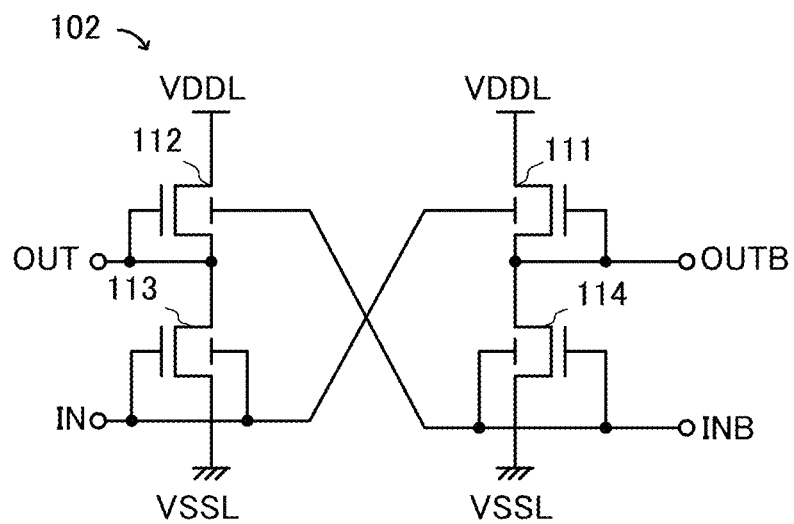

FIG. 1(B) is a circuit diagram illustrating a specific circuit configuration of the logic circuit 102. The logic circuit 102 illustrated in FIG. 1(B) is a two-wire logic circuit functioning as an inverter circuit.

The logic circuit 102 illustrated in FIG. 1(B) includes a transistor 111 to a transistor 114. In addition, a wiring VDDL supplied with a high power supply potential VDD and a wiring VSSL supplied with a low power supply potential VSS (e.g., ground potential) are illustrated in FIG. 1(B).

One of a gate and a back gate of the transistor 111 is connected to the terminal IN supplied with the input signal. One of a source and a drain of the transistor 111 is connected to the wiring VDDL. The other of the source and the drain of the transistor 111 is connected to the terminal OUTB that outputs the inverted output signal. The other of the gate and the back gate of the transistor 111 is connected to the terminal OUTB that outputs the inverted output signal. Note that each terminal can be rephrased as a wiring.

The transistor 111 is brought into an on state (also referred to as on) or an off state (also referred to as off) in accordance with a potential applied to the gate, and has a function of controlling whether or not to make the terminal OUTB to have a high-level potential based on the potential VDD. The transistor 111 has a function of being controlled to be of a depletion type (also referred to as normally on) or an enhancement type (also referred to as normally off) in accordance with a potential applied to the back gate. The transistor 111 is also referred to as a first transistor.

One of a gate and a back gate of the transistor 112 is connected to the terminal INB supplied with the inverted input signal. One of a source and a drain of the transistor 112 is connected to the wiring VDDL. The other of the source and the drain of the transistor 112 is connected to the terminal OUT that outputs the output signal. The other of the gate and the back gate of the transistor 112 is connected to the terminal OUT that outputs the output signal.

The transistor 112 is turned on or off in accordance with a potential applied to the gate, and has a function of controlling whether or not to make the terminal OUT to have a high-level potential based on the potential VDD. The transistor 112 has a function of being controlled to be normally on or normally off in accordance with a potential applied to the back gate. The transistor 112 is also referred to as a second transistor.

A gate and a back gate of the transistor 113 are connected to the terminal IN supplied with the input signal. Note that one of the gate and the back gate of the transistor 113 may be connected to the terminal IN. One of a source and a drain of the transistor 113 is connected to the terminal OUT that outputs the output signal. The other of the source and the drain of the transistor 113 is connected to the wiring VSSL.

The transistor 113 is turned on or off in accordance with the potential of the terminal IN applied to each of the gate and the back gate, and has a function of controlling whether or not to make the terminal OUT to have a low-level potential based on the potential VSS. The transistor 113 is also referred to as a third transistor.

A gate and a back gate of the transistor 114 are connected to the terminal INB supplied with the inverted input signal. Note that one of the gate and the back gate of the transistor 114 may be connected to the terminal INB. One of a source and a drain of the transistor 114 is connected to the terminal OUTB that outputs the inverted output signal. The other of the source and the drain of the transistor 114 is connected to the wiring VSSL.

The transistor 114 is turned on or off in accordance with the potential of the terminal INB applied to the gate and the back gate, and has a function of controlling whether or not to make the terminal OUTB to have a low-level potential based on the potential VSS. The transistor 114 is also referred to as a fourth transistor.

Next, the operation of the logic circuit 102 illustrated in FIG. 1(B) is described with reference to FIGS. 2(A) to 2(C).

Figure 2A:
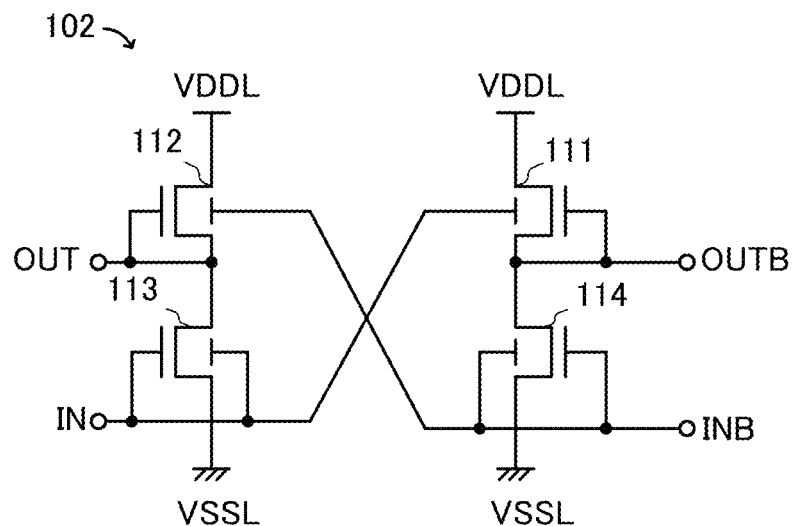
FIG. 2 (A) A circuit diagram, (B) a timing chart, and (C) a diagram illustrating a circuit symbol that illustrate a configuration example of a semiconductor device.
Figure 2B:
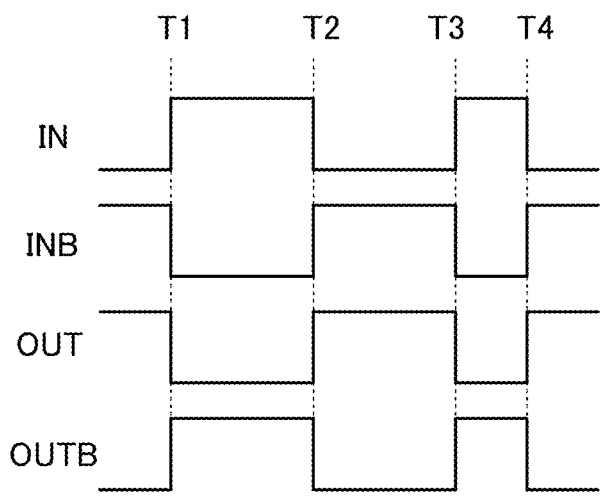
Figure 2C:
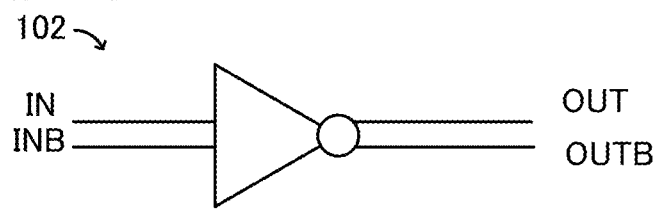

FIG. 2(A) illustrates a circuit diagram similar to that in FIG. 1(B), and FIG. 2(B) illustrates a timing chart for describing the operation of FIG. 2(A).

From Time T1 to T2 and from Time T3 to T4 in the timing chart illustrated in FIG. 2(B), the input signal supplied to the terminal IN is at a high level, and the inverted input signal supplied to the terminal INB is at a low level. The transistor 111 becomes normally on and the transistor 113 is turned on. The transistor 112 becomes normally off and the transistor 114 is turned off. The terminal OUT has a low-level potential based on the potential VSS. The terminal OUTB has a high-level potential based on the potential VDD.

Figure 3A:
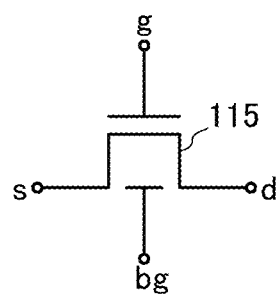
FIG. 3 (A) A circuit symbol and (B) a graph that illustrate a configuration example of a semiconductor device.
Figure 3B:
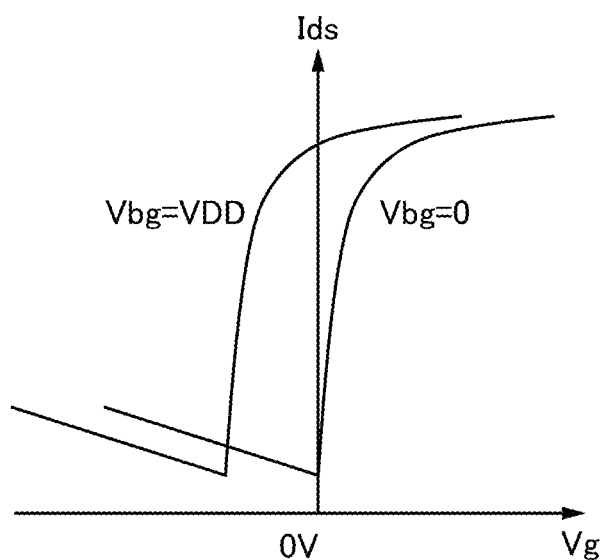

With such a configuration, potentials applied to the back gate of the transistor can be switched. In a circuit symbol of the transistor 115 shown as an example in FIG. 3(A), a gate of the transistor is g, a back gate of the transistor is bg, a source of the transistor is s, and a drain of the transistor is d, for example. FIG. 3(B) is a graph showing the relation between a current flowing through the drain of the transistor (Id) and a gate voltage (Vg) when a source potential is 0 V. As shown in the drawing, when a back gate voltage is set to the potential VSS (Vbg=0), the threshold voltage can be positively shifted, and the transistor 115 can be normally off. When the back gate voltage is set to the potential VDD (Vbg=VDD), the threshold voltage can be negatively shifted, and the transistor 115 can be normally on.

A high-level potential is applied to the back gate of the transistor 111, and a low-level potential is applied to the back gate of the transistor 112. As a result, the transistor 111 becomes a normally-on transistor and the transistor 112 becomes a normally-off transistor. Since the transistor 111 can function as a normally-on transistor, the amount of current flowing to the terminal OUTB can be increased. Furthermore, since the transistor 112 can function as a normally-off transistor, a shoot-through current between the wiring VDDL and the wiring VSSL can be surely reduced.

From Time T2 to T3 in the timing chart illustrated in FIG. 2(B), the input signal supplied to the terminal IN is at a low level, and the inverted input signal supplied to the terminal INB is at a high level. The transistor 111 becomes normally off and the transistor 113 is turned off. The transistor 112 becomes normally on and the transistor 114 is turned on. The terminal OUT has a high-level potential based on the potential VDD. The terminal OUTB has a low-level potential based on the potential VSS.

A low-level potential is applied to the back gate of the transistor 111, and a high-level potential is applied to the back gate of the transistor 112. As a result, the transistor 111 becomes a normally-off transistor and the transistor 112 becomes a normally-on transistor. Since the transistor 111 can function as a normally-off transistor, a shoot-through current between the wiring VDDL and the wiring VSSL can be surely reduced. Furthermore, since the transistor 112 can function as a normally-on transistor, the amount of current flowing to the terminal OUT can be increased.

The circuit diagram of the logic circuit 102 illustrated in FIG. 2(A) has a function of a two-wire inverter circuit. FIG. 2(C) illustrates a two-wire circuit symbol.

Figure 4:
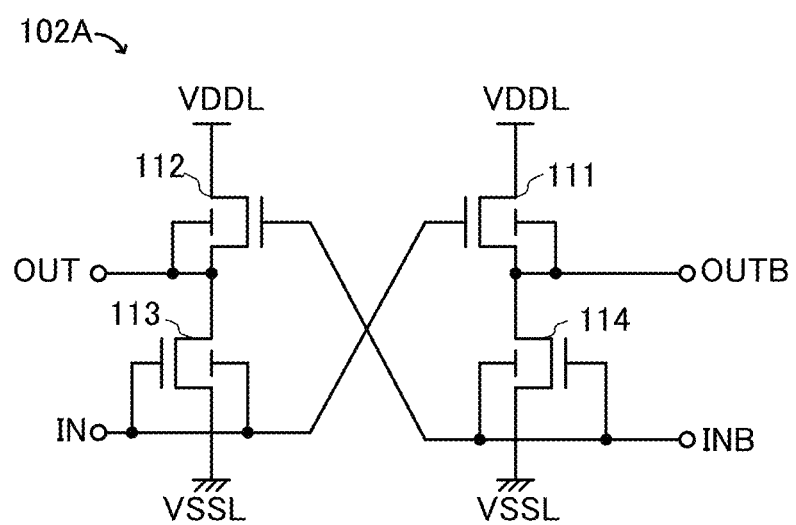
FIG. 4 A circuit diagram illustrating a configuration example of a semiconductor device.

Although FIG. 1(B) illustrates a configuration in which the terminal IN and the terminal INB are connected to the back gate sides of the transistor 111 and the transistor 112, the terminal IN and the terminal INB may be connected to the gate sides as in a circuit diagram of a logic circuit 102A illustrated in FIG. 4.

The thickness of a gate insulating film on the gate side and the thickness of a gate insulating film on the back gate side are different in the transistor. By switching the connections in FIG. 1(B) and FIG. 4, the electric field intensity to the channel formation region can be adjusted. Thus, the shift amount of the threshold voltage can be adjusted. The gate insulating films on the sides to which the terminal IN and the terminal INB are connected are preferably thin. With this configuration, the switching characteristics owing to the input signal and the inverted input signal supplied to the terminal IN and the terminal INB can be improved.

With the above-described configuration, a semiconductor device provided with a logic circuit composed of OS transistors can achieve highly reliable operation and can have low power consumption.

Next, a configuration example of a logic circuit different from that in FIG. 1(B) is described.

Figure 5A:
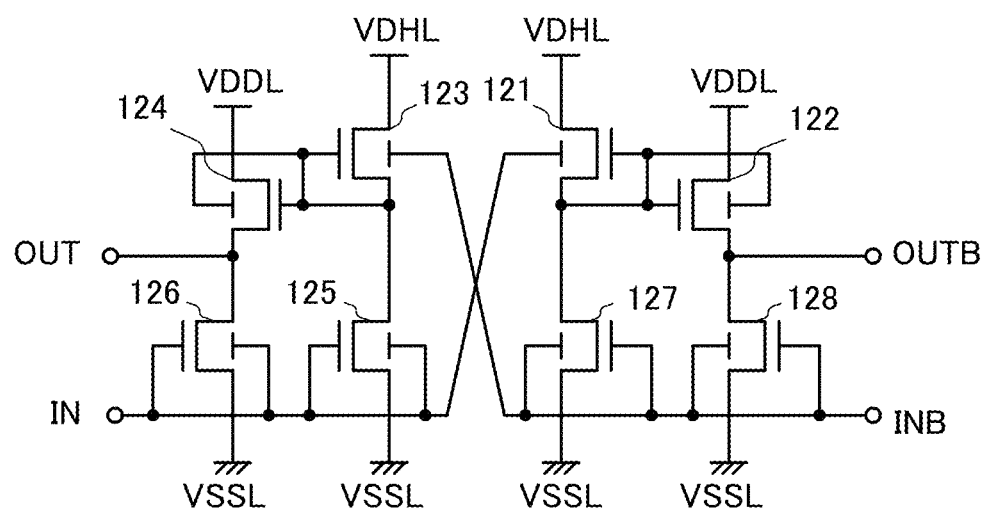
FIG. 5 (A) A circuit diagram and (B) a circuit diagram that illustrate configuration examples of a semiconductor device.

A logic circuit 102B illustrated in FIG. 5(A) is a circuit diagram of a two-wire logic circuit functioning as an inverter circuit as in FIG. 1(B).

The logic circuit 102B illustrated in FIG. 5(A) includes a transistor 121 to a transistor 128. In addition, a wiring VDHL supplied with a high power supply potential VDH, the wiring VDDL supplied with the high power supply potential VDD, and the wiring VSSL supplied with the low power supply potential VSS are illustrated in FIG. 5(A). Note that the high power supply potential VDH is a potential higher than the high power supply potential VDD.

One of a gate and a back gate of the transistor 121 is connected to the terminal IN supplied with the input signal. One of a source and a drain of the transistor 121 is connected to the wiring VDHL. The other of the source and the drain of the transistor 121 is connected to a gate and a back gate of the transistor 122. The other of the gate and the back gate of the transistor 121 is connected to the gate and the back gate of the transistor 122.

The transistor 121 is turned on or off in accordance with a potential applied to the gate, and has a function of controlling whether or not to make each of the potentials of the gate and the back gate of the transistor 122 to be a potential based on the potential VDH. The transistor 121 has a function of being controlled to be normally on or normally off in accordance with a potential applied to the back gate. The transistor 121 is also referred to as a first transistor.

One of a source and a drain of the transistor 122 is connected to the wiring VDDL. The other of the source and the drain of the transistor 122 is connected to the terminal OUTB.

The transistor 122 is turned on or off in accordance with potentials applied to the gate and the back gate, and has a function of controlling whether or not to make the terminal OUTB to have a high-level potential based on the potential VDD. The transistor 122 is also referred to as a second transistor.

One of a gate and a back gate of the transistor 123 is connected to the terminal INB supplied with the inverted input signal. One of a source and a drain of the transistor 123 is connected to the wiring VDHL. The other of the source and the drain of the transistor 123 is connected to a gate and a back gate of the transistor 124. The other of the gate and the back gate of the transistor 123 is connected to the gate and the back gate of the transistor 124.

The transistor 123 is turned on or off in accordance with a potential applied to the gate, and has a function of controlling whether or not to make each of the potentials of the gate and the back gate of the transistor 124 to be a potential based on the potential VDH. The transistor 123 has a function of being controlled to be normally on or normally off in accordance with a potential applied to the back gate. The transistor 123 is also referred to as a third transistor.

One of a source and a drain of the transistor 124 is connected to the wiring VDDL. The other of the source and the drain of the transistor 124 is connected to the terminal OUT.

The transistor 124 is turned on or off in accordance with potentials applied to the gate and the back gate, and has a function of controlling whether or not to make the terminal OUT to have a high-level potential based on the potential VDD. The transistor 124 is also referred to as a fourth transistor.

A gate and a back gate of the transistor 125 are connected to the terminal IN supplied with the input signal. Note that one of the gate and the back gate of the transistor 125 may be connected to the terminal IN. One of a source and a drain of the transistor 125 is connected to the gate and the back gate of the transistor 124. The other of the source and the drain of the transistor 125 is connected to the wiring VSSL.

The transistor 125 is turned on or off in accordance with the potential of the terminal IN applied to each of the gate and the back gate, and has a function of controlling whether or not to make each of the potentials of the gate and the back gate of the transistor 124 to be a low-level potential based on the potential VSS. The transistor 125 is also referred to as a fifth transistor.

A gate and a back gate of the transistor 126 are connected to the terminal IN supplied with the input signal. Note that one of the gate and the back gate of the transistor 126 may be connected to the terminal IN. One of a source and a drain of the transistor 126 is connected to the terminal OUT that outputs the output signal. The other of the source and the drain of the transistor 126 is connected to the wiring VSSL.

The transistor 126 is turned on or off in accordance with the potential of the terminal IN applied to each of the gate and the back gate, and has a function of controlling whether or not to make the terminal OUT to have a low-level potential based on the potential VSS. The transistor 126 is also referred to as a sixth transistor.

A gate and a back gate of the transistor 127 are connected to the terminal INB supplied with the inverted input signal. Note that one of the gate and the back gate of the transistor 127 may be connected to the terminal INB. One of a source and a drain of the transistor 127 is connected to the gate and the back gate of the transistor 122. The other of the source and the drain of the transistor 127 is connected to the wiring VSSL.

The transistor 127 is turned on or off in accordance with the potential of the terminal INB applied to each of the gate and the back gate, and has a function of controlling whether or not to make each of the potentials of the gate and the back gate of the transistor 122 to be a low-level potential based on the potential VSS. The transistor 127 is also referred to as a seventh transistor.

A gate and a back gate of the transistor 128 are connected to the terminal INB supplied with the inverted input signal. Note that one of the gate and the back gate of the transistor 128 may be connected to the terminal INB. One of a source and a drain of the transistor 128 is connected to the terminal OUTB that outputs the inverted output signal. The other of the source and the drain of the transistor 128 is connected to the wiring VSSL.

The transistor 128 is turned on or off in accordance with the potential of the terminal INB applied to each of the gate and the back gate, and has a function of controlling whether or not to make the terminal OUTB to have a low-level potential based on the potential VSS. The transistor 128 is also referred to as an eighth transistor.

Figure 5B:
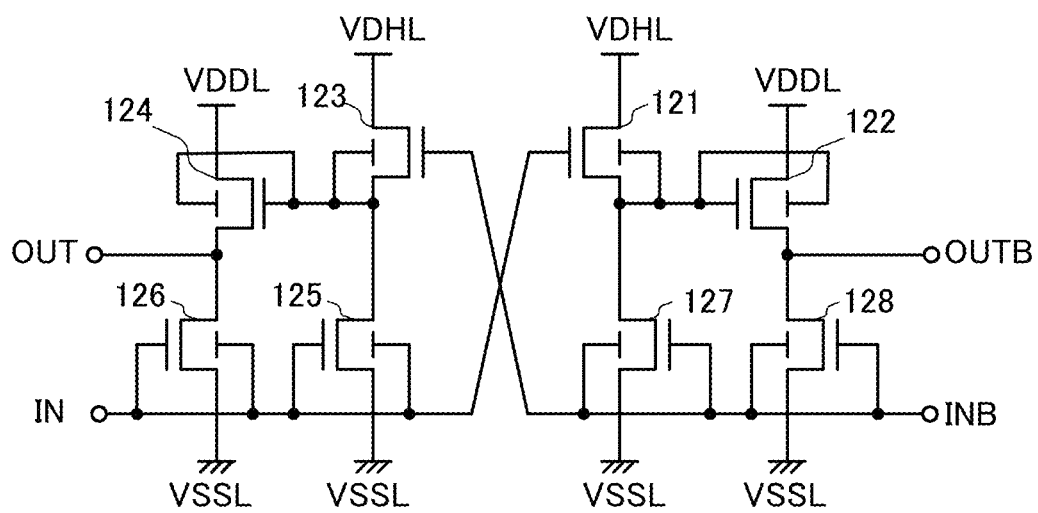

Although FIG. 5(A) illustrates a configuration in which the terminal IN and the terminal INB are connected to the back gate sides of the transistor 121 and the transistor 123, the terminal IN and the terminal INB may be connected to the gate sides as in a circuit diagram of a logic circuit 102C illustrated in FIG. 5(B).

The thickness of a gate insulating film on the gate side and the thickness of a gate insulating film on the back gate side are different in the transistor. By switching the connections in FIG. 5(A) and FIG. 5(B), the electric field intensity to the channel formation region can be adjusted. Thus, the shift amount of the threshold voltage can be adjusted. The gate insulating films on the sides to which the terminal IN and the terminal INB are connected are preferably thin. With this configuration, the switching characteristics owing to the input signal and the inverted input signal supplied to the terminal IN and the terminal INB can be improved.

Next, the operation of the logic circuit 102B illustrated in FIG. 5(A) is described with reference to FIGS. 6(A) and 6(B).

Figure 6A:
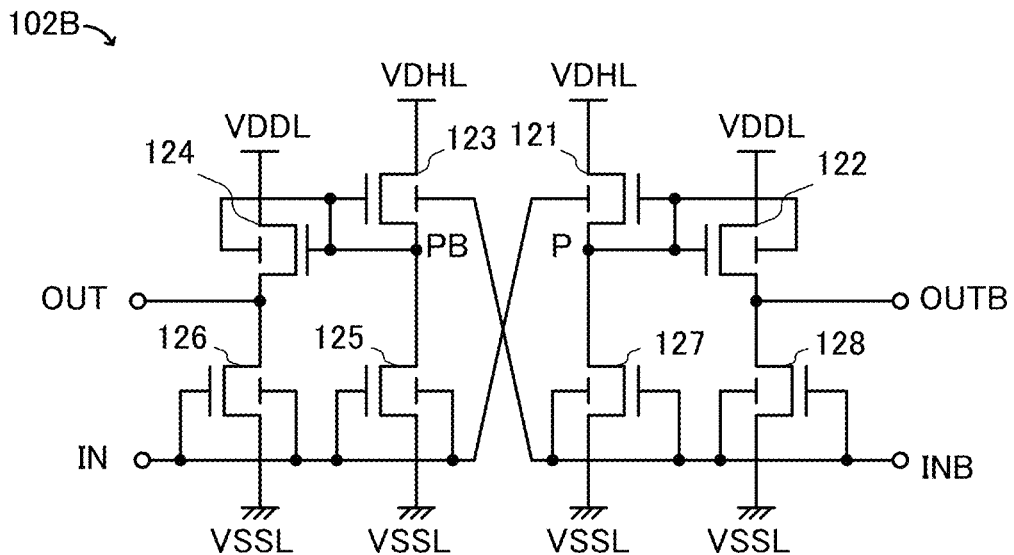
FIG. 6 (A) A circuit diagram and (B) a timing chart that illustrate a configuration example of a semiconductor device.
Figure 6B:
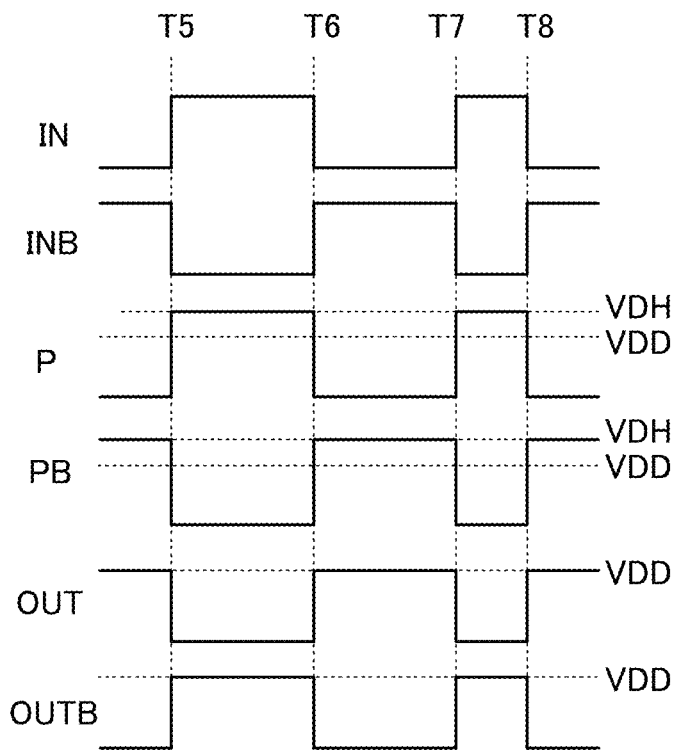

FIG. 6(A) illustrates a circuit diagram similar to that in FIG. 5(A), and FIG. 6(B) illustrates a timing chart for describing the operation of FIG. 6(A). Note that in FIG. 6(A), a node of the gate and the back gate of the transistor 122 is illustrated as a node P. Moreover, a node of the gate and the back gate of the transistor 124 is illustrated as a node PB.

From Time T5 to T6 and from Time T7 to T8 in the timing chart illustrated in FIG. 6(B), the input signal supplied to the terminal IN is at a high level, and the inverted input signal supplied to the terminal INB is at a low level. The transistor 121 becomes normally on and the transistor 125 and the transistor 126 are turned on. The transistor 123 becomes normally off and the transistor 127 and the transistor 128 are turned off. The node P has a high-level potential based on the potential VDH and the transistor 122 is turned on. The node PB has a low-level potential based on the potential VSS and the transistor 124 is turned off. The terminal OUT has a low-level potential based on the potential VSS. The terminal OUTB has a high-level potential based on the potential VDD.

A high-level potential is applied to the back gate of the transistor 121, and a low-level potential is applied to the back gate of the transistor 123. As a result, the transistor 121 becomes a normally-on transistor and the transistor 123 becomes a normally-off transistor. Since the transistor 121 can function as a normally-on transistor, the amount of current flowing through the gate and the back gate of the transistor 122 can be increased. Furthermore, since the transistor 123 can function as a normally-off transistor, a shoot-through current between the wiring VDHL and the wiring VSSL can be surely reduced.

In addition, in the configuration in FIG. 6(A), the node P can have a potential based on the potential VDH, which is higher than the potential VDD. Thus, a voltage applied between the gate and the source of the transistor 122 can be increased and a drop of the amount of threshold voltage in voltage can be made small, so that the potential of the terminal OUTB can be set to the potential VDD more surely.

Figure 24A:
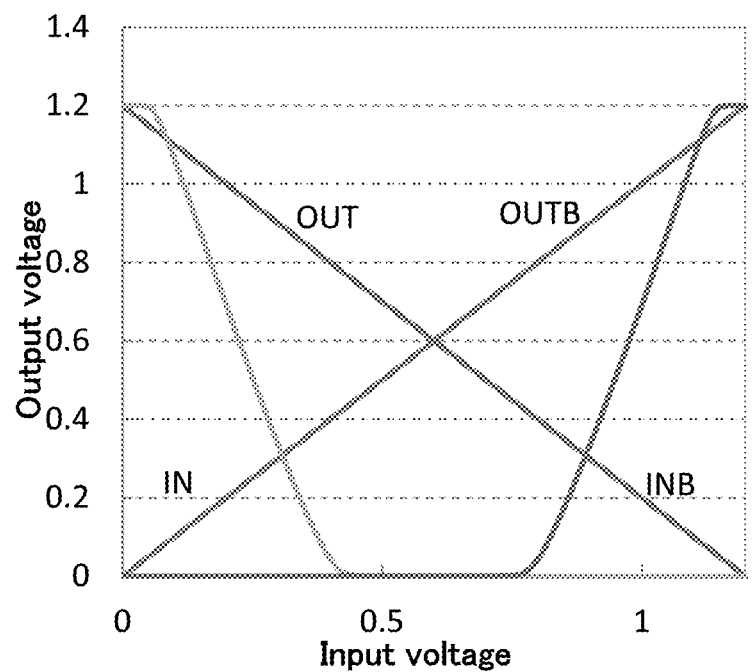
FIG. 24 (A) A graph and (B) a graph each illustrating the operation of a semiconductor device.
Figure 24B:
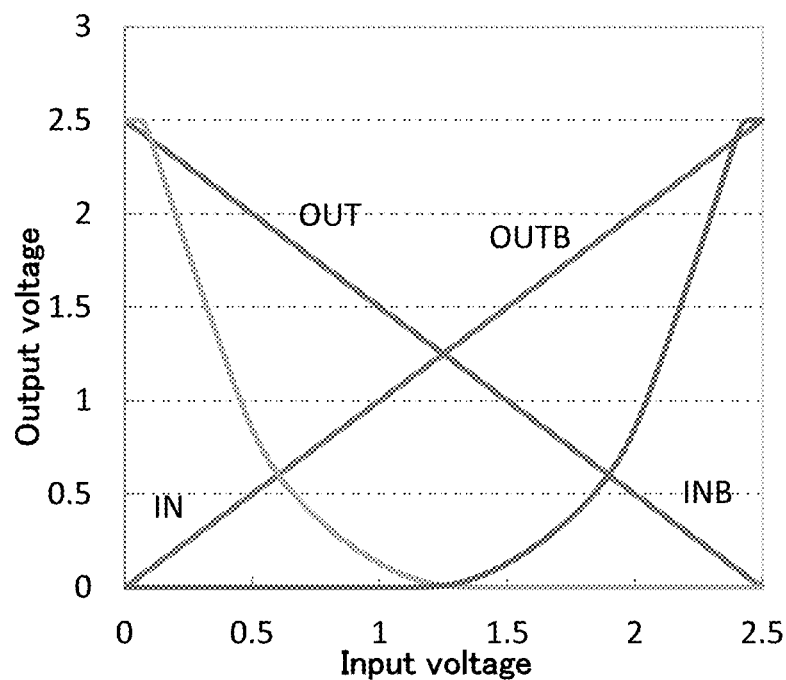

FIGS. 24(A) and 24(B) show graphs of waveforms of the input signal (IN), the inverted input signal (INB), the output signal (OUT), and the inverted output signal (OUTB), which are obtained by circuit simulation. A power supply voltage is 1.2 V in FIG. 24(A) and a power supply voltage is 2.5 V in FIG. 24(B). A signal of the output signal (output voltage) in accordance with the voltage of the input signal (input voltage) was obtained in each case.

From Time T6 to T7 in the timing chart illustrated in FIG. 6(B), the input signal supplied to the terminal IN is at a low level, and the inverted input signal supplied to the terminal INB is at a high level. The transistor 121 becomes normally off and the transistor 125 and the transistor 126 are turned off. The transistor 123 becomes normally on and the transistor 127 and the transistor 128 are turned on. The node P has a low-level potential based on the potential VSS and the transistor 122 is turned off. The node PB has a high-level potential based on the potential VDH and the transistor 124 is turned on. The terminal OUT has a low-level potential based on the potential VSS. The terminal OUTB has a high-level potential based on the potential VDD.

A low-level potential is applied to the back gate of the transistor 121, and a high-level potential is applied to the back gate of the transistor 123. As a result, the transistor 121 becomes a normally-off transistor and the transistor 123 becomes a normally-on transistor. Since the transistor 121 can function as a normally-off transistor, a shoot-through current between the wiring VDHL and the wiring VSSL can be surely reduced. Furthermore, since the transistor 123 can function as a normally-on transistor, the amount of current flowing through the gate and the back gate of the transistor 124 can be increased, In addition, in the configuration in FIG. 6(A), the node PB can have a potential based on the potential VDH, which is higher than the potential VDD. Thus, a voltage applied between the gate and the source of the transistor 124 can be increased and a drop of the amount of threshold voltage in voltage can be made small, so that the potential of the terminal OUTB can be set to the potential VDD more surely.

The circuit diagram of the logic circuit 102B illustrated in FIG. 6(A) has a function of a two-wire inverter circuit. Therefore, as in FIG. 2(A), the two-wire circuit symbol illustrated in FIG. 2(C) can be represented.

With the above-described configuration, a semiconductor device provided with a logic circuit composed of OS transistors can achieve highly reliable operation and can have low power consumption. In addition, a drop in the voltage of the output signal can be suppressed.

By applying the above-described configuration, a basic combinational circuit can be formed.

Figure 7:
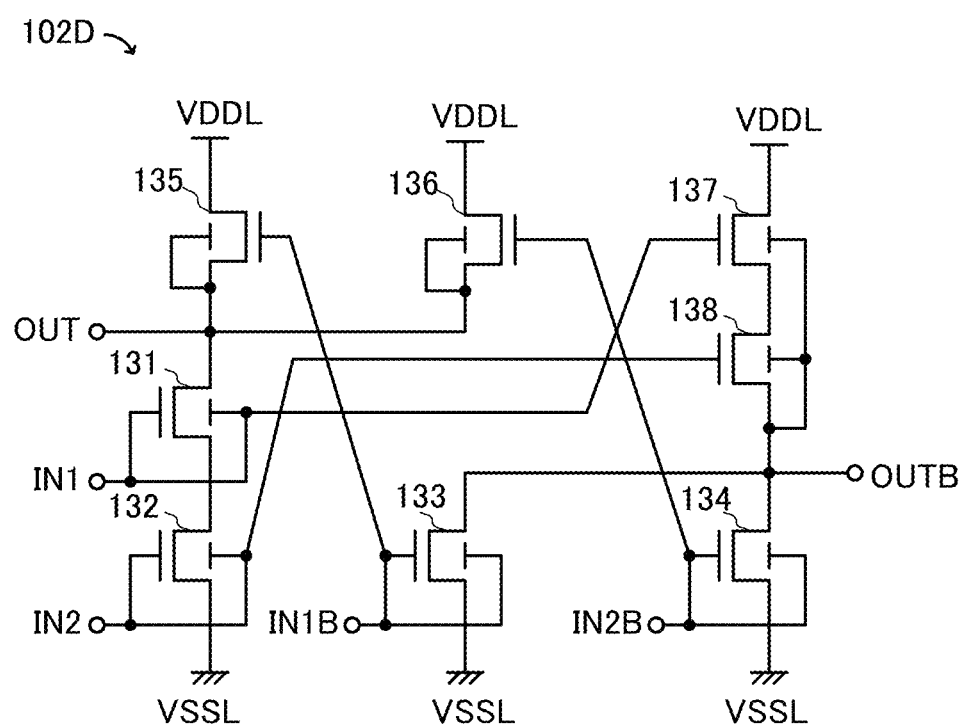
FIG. 7 A circuit diagram illustrating a configuration example of a semiconductor device.

FIG. 7 is a circuit diagram of a logic circuit to which the configuration in FIG. 4 is applied. A logic circuit 102D illustrated in FIG. 7 includes transistors 131 to 138. In addition, the wiring VDDL supplied with the high power supply potential VDD and the wiring VSSL supplied with the low power supply potential VSS are illustrated in FIG. 7. Terminals IN1, IN1B, and IN2 and a terminal IN2B are terminals that supply input signals. The terminal OUT and the terminal OUTB are terminals that supply output signals. An output signal corresponding to the negative logical product of the input signals (negative logical sum of the inverted input signals) is obtained from the terminal OUT, and an output signal corresponding to the negative logical product of the input signals (logical product of the inverted input signals) is obtained from the terminal OUTB. The functions of the logic circuit may be switched by interchanging signals input to the terminals. A truth table of the logic circuit illustrated in FIG. 7 is as Table 1.

TABLE 1

| IN1 | IN1B | IN2 | IN2B | OUT | OUTB |
|-----|------|-----|------|-----|------|
| 0   | 1    | 0   | 1    | 1   | 0    |
| 1   | 0    | 0   | 1    | 1   | 0    |

TABLE 1-continued

| IN1 | IN1B | IN2 | IN2B | OUT | OUTB |
|---|---|---|---|---|---|
| 0 | 1 | 1 | 0 | 1 | 0 |
| 1 | 0 | 1 | 0 | 0 | 1 |

With the use of the above-described combinational circuit, a complicated circuit such as a counter, a serial-parallel converter, or a processor can be provided. These circuits can be composed of OS transistors, and thus can maintain favorable switching characteristics even in a high-temperature environment. Furthermore, owing to a reduction in a shoot-through current, power consumption can be reduced and a drop of the amount of threshold voltage in voltage can be suppressed, for example.

FIG. 8 illustrates an example of a perspective view of an IC in which the logic circuit which is a semiconductor device is incorporated.

Figure 8A:
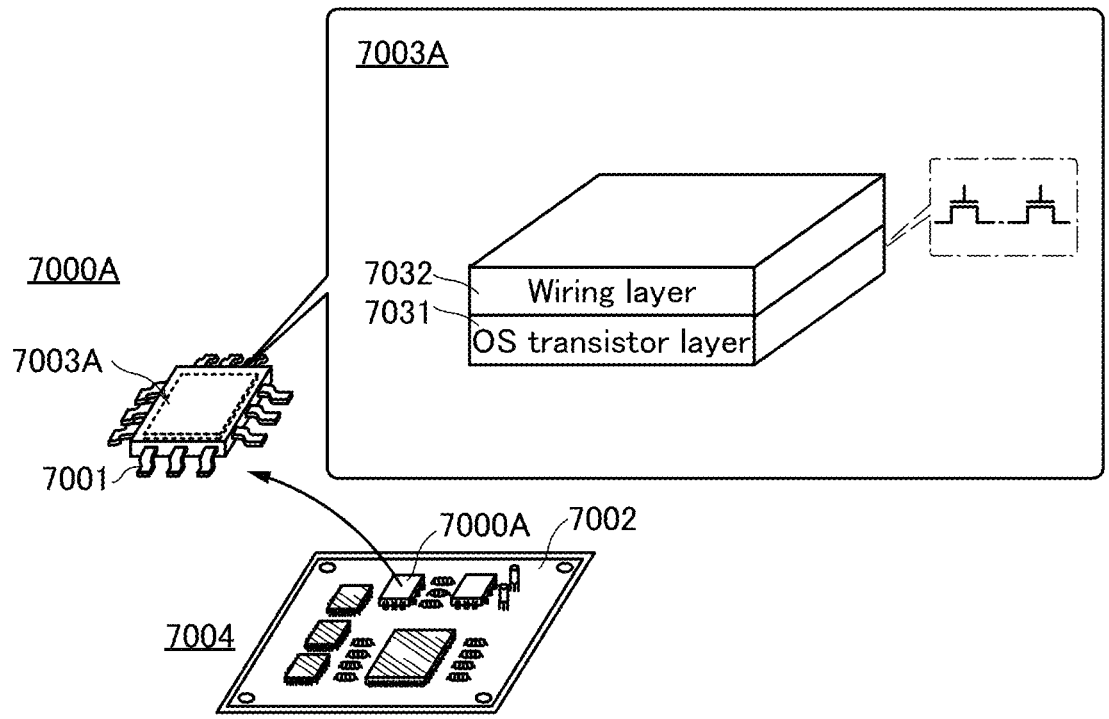
FIG. 8 (A) A perspective view and (B) a perspective view that illustrate structure examples of a semiconductor device.

FIG. 8(A) illustrates an example of an IC. An IC 7000A illustrated in FIG. 8(A) includes a lead 7001 and a circuit portion 7003A. The IC 7000A is mounted on a printed circuit board 7002, for example. A plurality of such IC chips are combined and electrically connected to each other on the printed circuit board 7002; thus, a board on which electronic components are mounted (a mounting board 7004) is completed. In the circuit portion 7003A, the various circuits described in the above embodiment are provided on one die or divided and provided on a plurality of dies. The circuit portion 7003A is roughly divided into an OS transistor layer 7031 and a wiring layer 7032.

Figure 8B:
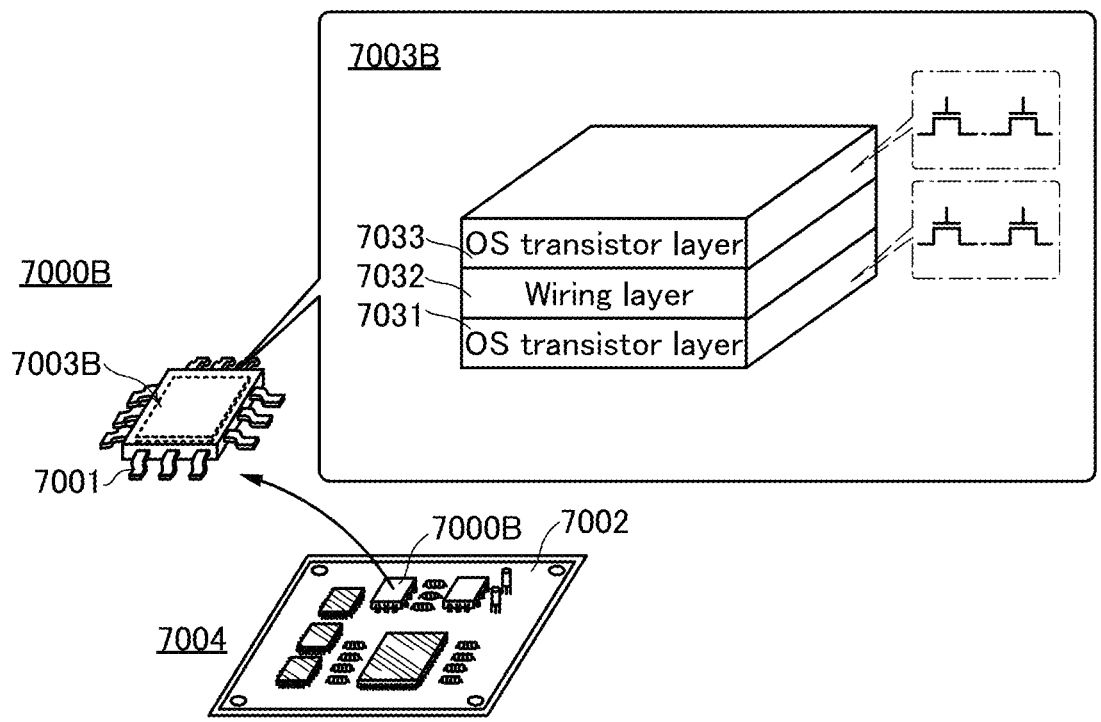

Note that the OS transistor layer may be a single layer or have a stacked-layer structure in which the wiring layer is interposed. Specifically, another example of an IC is illustrated in FIG. 8(B). An IC 7000B illustrated in FIG. 8(B) includes the lead 7001 and a circuit portion 7003B. The IC 7000B is mounted on the printed circuit board 7002, for example. A plurality of such IC chips are combined and electrically connected to each other on the printed circuit board 7002; thus, a board on which electronic components are mounted (the mounting board 7004) is completed. In the circuit portion 7003B, the various circuits described in the above embodiment are provided on one die or divided and provided on a plurality of dies. The circuit portion 7003A is roughly divided into the OS transistor layer 7031, the wiring layer 7032, and an OS transistor layer 7033. The OS transistor layer 7031 is connected to the OS transistor layer 7033 with the wiring layer 7032 therebetween. Another OS transistor layer can be provided over the OS transistor layer 7033 with another wiring layer therebetween. A plurality of OS transistor layers can be stacked, so that the circuit portion 7003B can be easily reduced in size.

Although a QFP (Quad Flat Package) is used as a package of each of the ICs 7000A and 7000B in FIGS. 8(A) and 8(B), the embodiment of the package is not limited thereto.

The structure, method, and the like described above in this embodiment can be used in combination as appropriate with the structures, methods, and the like described in the other embodiments.

Embodiment 2

A configuration of a semiconductor device of one embodiment of the present invention, which is different from the semiconductor device described in Embodiment 1, will be described.

Figure 9A:
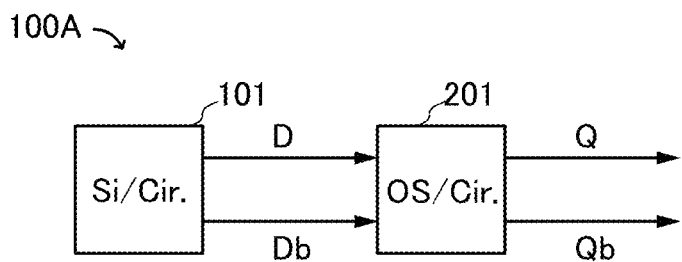
FIG. 9 (A) A block diagram, (B) a circuit diagram, and (C) a circuit diagram that illustrate a configuration example of a semiconductor device.

FIG. 9(A) is a block diagram of a semiconductor device of this embodiment. A semiconductor device 100A described in this embodiment can be roughly divided into the signal generation circuit 101 and a signal processing circuit 201.

Note that in this specification and the like, a semiconductor device generally means a device that can function by utilizing semiconductor characteristics. Thus, the signal generation circuit 101 and the signal processing circuit 201 are separately or collectively referred to as a semiconductor device in some cases.

The signal generation circuit 101 has a function of outputting an input signal and an inverted input signal from a terminal D and a terminal Db. The signal generation circuit 101 includes a circuit composed of Si transistors (denoted by Si/Cir.). When appropriately designed using a sequential circuit and a combinational circuit with the use of a CMOS circuit, the signal generation circuit 101 can be configured.

The signal processing circuit 201 includes a circuit composed of OS transistors (denoted by OS/Cir.). The signal processing circuit 201 includes a sequential circuit and a combinational circuit. An example of the combinational circuit is an inverter circuit (also referred to as a NOT circuit), a logical product circuit (AND circuit), or the like. The sequential circuit is a flip-flop circuit, a counter circuit, or the like. The signal processing circuit 201 has a function of processing the input signal and the inverted input signal in an internal circuit and outputting the processed signals as an output signal and an inverted output signal from a terminal Q and a terminal Qb.

Figure 9B:
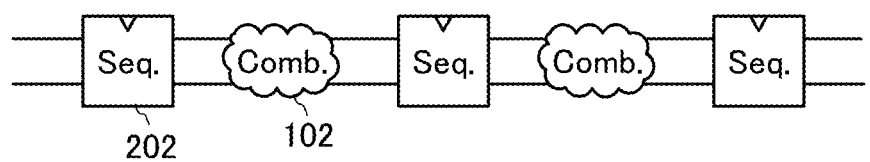

FIG. 9(B) is a circuit diagram illustrating an example of a circuit of the signal processing circuit 201. The signal processing circuit 201 illustrated in FIG. 9(B) has a circuit configuration in which a plurality of logic circuits 202 functioning as sequential circuits (denoted by Seq. in the drawing) and a plurality of the logic circuits 102 functioning as combinational circuits (denoted by Comb. in the drawing) are combined.

The logic circuit 202 is a two-wire sequential circuit composed of OS transistors. Unlike a Si transistor, an OS transistor has a small change in electrical characteristics in a high-temperature environment. Therefore, highly reliable operation can be performed even in a high-temperature environment.

Figure 9C:
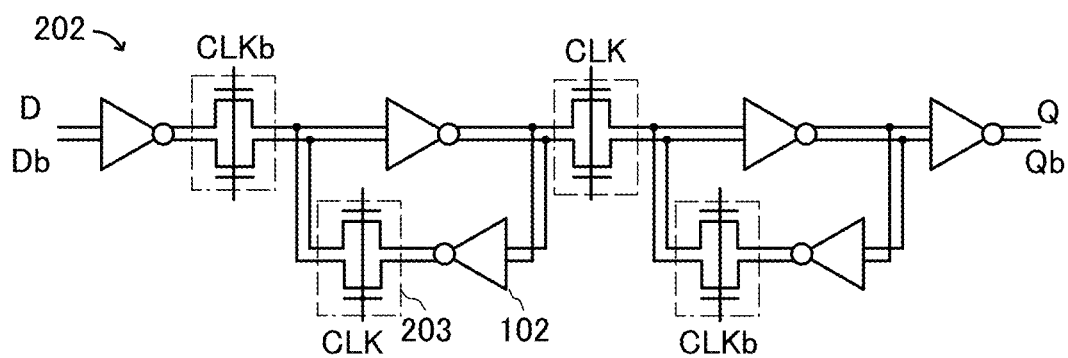

FIG. 9(C) is a circuit diagram illustrating a specific circuit configuration of the logic circuit 202. The logic circuit 202 illustrated in FIG. 9(C) is a two-wire flip-flop circuit including a switch and a logic circuit functioning as an inverter circuit.

The logic circuit 202 illustrated in FIG. 9(C) includes switch circuits 203 whose on and off are controlled in accordance with a clock signal CLK and an inverted clock signal CLKb and the logic circuits 102 functioning as inverter circuits.

Figure 10A:
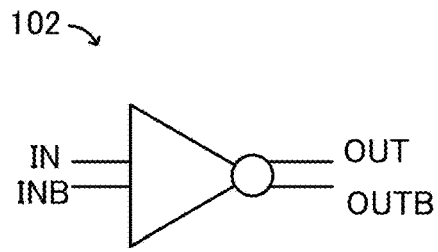
FIG. 10 (A) A diagram illustrating a circuit symbol, (B) a diagram illustrating a circuit symbol, (C) a circuit diagram, and (D) a timing chart that illustrate a configuration example of a semiconductor device.
Figure 10B:
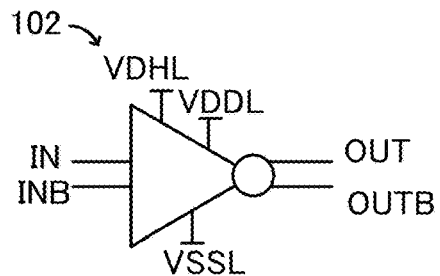

Note that the logic circuit 102 illustrated in FIG. 9(C) represents a two-wire inverter circuit as described with reference to FIGS. 2(A) to 2(C). FIG. 10(A) illustrates the two-wire circuit symbol, which is similar to that in FIG. 2(C). The logic circuit 102 is connected to the wiring VDHL supplied with the high power supply potential VDH, the wiring VDDL supplied with the high power supply potential VDD, and the wiring VSSL supplied with the low power supply potential VSS. Thus, the circuit symbols in FIG. 2(C) and FIG. 10(A) can be represented as a circuit symbol illustrated in FIG. 10(B). Note that wiring names added to FIG. 10(B) are omitted in some cases.

Figure 10C:
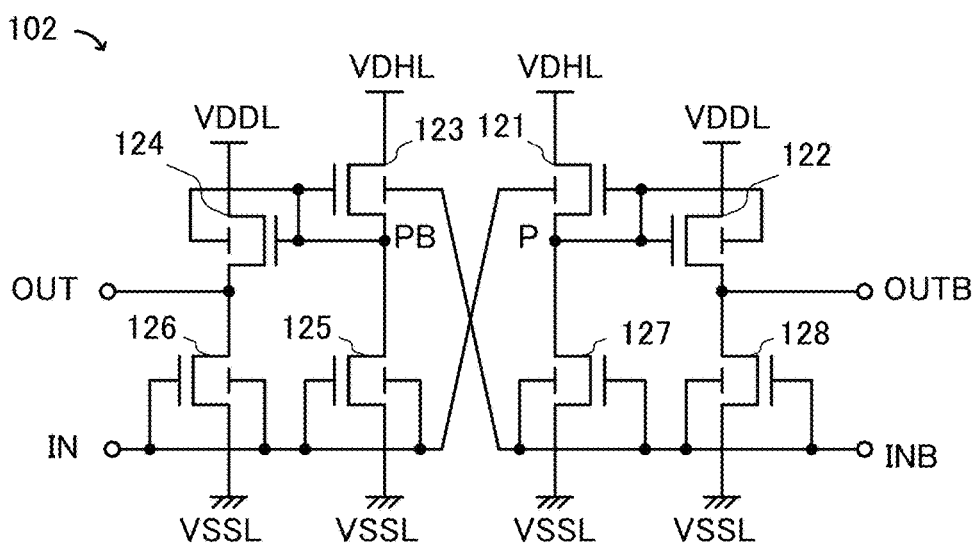

FIG. 10(C) is a circuit diagram of a specific circuit configuration of the logic circuit 102, which can be represented by the logic circuit 102B described with reference to FIG. 6(A). The logic circuit 102 illustrated in FIG. 10(C) includes the transistor 121 to the transistor 128. In addition, the wiring VDHL supplied with the high power supply potential VDH, the wiring VDDL supplied with the high power supply potential VDD, and the wiring VSSL supplied with the low power supply potential VSS are illustrated in FIG. 10(C). Note that the high power supply potential VDH is a potential higher than the high power supply potential VDD. Note that in FIG. 10(C), a node of the gate and the back gate of the transistor 122 is illustrated as the node P. Moreover, a node of the gate and the back gate of the transistor 124 is illustrated as the node PB.

One of the gate and the back gate of the transistor 121 is connected to the terminal IN supplied with the input signal. One of the source and the drain of the transistor 121 is connected to the wiring VDHL. The other of the source and the drain of the transistor 121 is connected to the gate and the back gate of the transistor 122. The other of the gate and the back gate of the transistor 121 is connected to the gate and the back gate of the transistor 122.

The transistor 121 is turned on or off in accordance with a potential applied to the gate, and has a function of controlling whether or not to make each of the potentials of the gate and the back gate of the transistor 122 to be a potential based on the potential VDH. The transistor 121 has a function of being controlled to be normally on or normally off in accordance with a potential applied to the back gate. The transistor 121 is also referred to as a first transistor.

One of the source and the drain of the transistor 122 is connected to the wiring VDDL. The other of the source and the drain of the transistor 122 is connected to the terminal OUTB.

The transistor 122 is turned on or off in accordance with potentials applied to the gate and the back gate, and has a function of controlling whether or not to make the terminal OUTB to have a high-level potential based on the potential VDD. The transistor 122 is also referred to as a second transistor.

One of the gate and the back gate of the transistor 123 is connected to the terminal INB supplied with the inverted input signal. One of the source and the drain of the transistor 123 is connected to the wiring VDHL. The other of the source and the drain of the transistor 123 is connected to the gate and the back gate of the transistor 124. The other of the gate and the back gate of the transistor 123 is connected to the gate and the back gate of the transistor 124.

The transistor 123 is turned on or off in accordance with a potential applied to the gate, and has a function of controlling whether or not to make each of the potentials of the gate and the back gate of the transistor 124 to be a potential based on the potential VDH. The transistor 123 has a function of being controlled to be normally on or normally off in accordance with a potential applied to the back gate. The transistor 123 is also referred to as a third transistor.

One of the source and the drain of the transistor 124 is connected to the wiring VDDL. The other of the source and the drain of the transistor 124 is connected to the terminal OUT.

The transistor 124 is turned on or off in accordance with potentials applied to the gate and the back gate, and has a function of controlling whether or not to make the terminal OUT to have a high-level potential based on the potential VDD. The transistor 124 is also referred to as a fourth transistor.

The gate and the back gate of the transistor 125 are connected to the terminal IN supplied with the input signal. Note that one of the gate and the back gate of the transistor 125 may be connected to the terminal IN. One of the source and the drain of the transistor 125 is connected to the gate and the back gate of the transistor 124. The other of the source and the drain of the transistor 125 is connected to the wiring VSSL.

The transistor 125 is turned on or off in accordance with the potential of the terminal IN applied to each of the gate and the back gate, and has a function of controlling whether or not to make each of the potentials of the gate and the back gate of the transistor 124 to be a low-level potential based on the potential VSS. The transistor 125 is also referred to as a fifth transistor.

The gate and the back gate of the transistor 126 are connected to the terminal IN supplied with the input signal. Note that one of the gate and the back gate of the transistor 126 may be connected to the terminal IN. One of the source and the drain of the transistor 126 is connected to the terminal OUT that outputs the output signal. The other of the source and the drain of the transistor 126 is connected to the wiring VSSL.

The transistor 126 is turned on or off in accordance with the potential of the terminal IN applied to each of the gate and the back gate, and has a function of controlling whether or not to make the terminal OUT to have a low-level potential based on the potential VSS. The transistor 126 is also referred to as a sixth transistor.

The gate and the back gate of the transistor 127 are connected to the terminal INB supplied with the inverted input signal. Note that one of the gate and the back gate of the transistor 127 may be connected to the terminal INB. One of the source and the drain of the transistor 127 is connected to the gate and the back gate of the transistor 122. The other of the source and the drain of the transistor 127 is connected to the wiring VSSL.

The transistor 127 is turned on or off in accordance with the potential of the terminal INB applied to each of the gate and the back gate, and has a function of controlling whether or not to make each of the potentials of the gate and the back gate of the transistor 122 to be a low-level potential based on the potential VSS. The transistor 127 is also referred to as a seventh transistor.

The gate and the back gate of the transistor 128 are connected to the terminal INB supplied with the inverted input signal. Note that one of the gate and the back gate of the transistor 128 may be connected to the terminal INB. One of the source and the drain of the transistor 128 is connected to the terminal OUTB that outputs the inverted output signal. The other of the source and the drain of the transistor 128 is connected to the wiring VSSL.

The transistor 128 is turned on or off in accordance with the potential of the terminal INB applied to each of the gate and the back gate, and has a function of controlling whether or not to make the terminal OUTB to have a low-level potential based on the potential VSS. The transistor 128 is also referred to as an eighth transistor.

With such a configuration, potentials applied to the back gate of the transistor can be switched as described with reference to FIGS. 3(A) and 3(B).

Figure 10D:
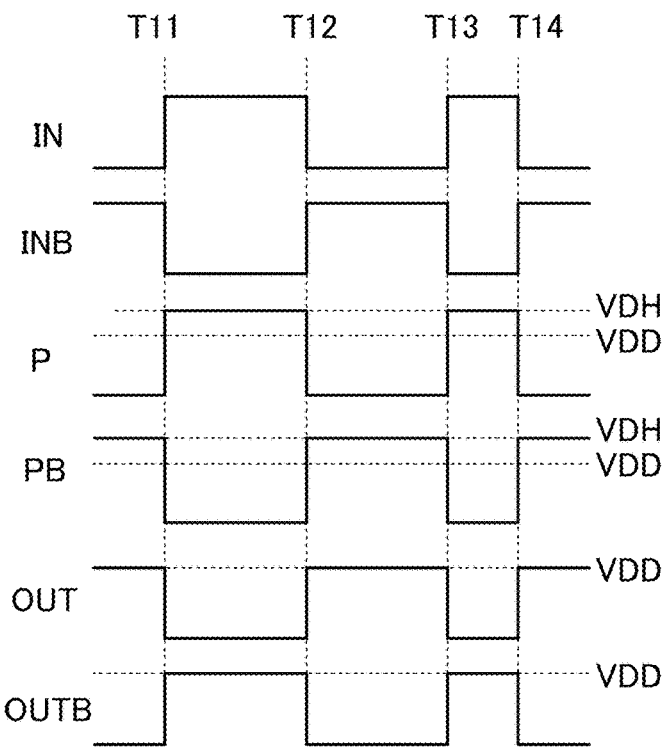

Next, the operation of the logic circuit 102 illustrated in FIG. 10(C) is described with reference to FIG. 10(D). FIG. 10(D) illustrates a timing chart for describing the operation of the logic circuit 102 illustrated in FIG. 10(C). The timing chart illustrated in FIG. 10(D) is similar to the timing chart described with reference to FIG. 6(B).

From Time T11 to T12 and from Time T13 to T14 in the timing chart illustrated in FIG. 10(C), the input signal supplied to the terminal IN is at a high level, and the inverted input signal supplied to the terminal INB is at a low level. The transistor 121 becomes normally on and the transistor 125 and the transistor 126 are turned on. The transistor 123 becomes normally off and the transistor 127 and the transistor 128 are turned off. The node P has a high-level potential based on the potential VDH and the transistor 122 is turned on. The node PB has a low-level potential based on the potential VSS and the transistor 124 is turned off. The terminal OUT has a low-level potential based on the potential VSS. The terminal OUTB has a high-level potential based on the potential VDD.

A high-level potential is applied to the back gate of the transistor 121, and a low-level potential is applied to the back gate of the transistor 123. As a result, the transistor 121 becomes a normally-on transistor and the transistor 123 becomes a normally-off transistor. Since the transistor 121 can function as a normally-on transistor, the amount of current flowing through the gate and the back gate of the transistor 122 can be increased. Furthermore, since the transistor 123 can function as a normally-off transistor, a shoot-through current between the wiring VDHL and the wiring VSSL can be surely reduced.

In addition, in the configuration in FIG. 10(C), the node P can have a potential based on the potential VDH, which is higher than the potential VDD. Thus, a voltage applied between the gate and the source of the transistor 122 can be increased and a drop of the amount of threshold voltage in voltage can be made small, so that the potential of the terminal OUTB can be set to the potential VDD more surely.

From Time T12 to T13 in the timing chart illustrated in FIG. 10(D), the input signal supplied to the terminal IN is at a low level, and the inverted input signal supplied to the terminal INB is at a high level. The transistor 121 becomes normally off and the transistor 125 and the transistor 126 are turned off. The transistor 123 becomes normally on and the transistor 127 and the transistor 128 are turned on. The node P has a low-level potential based on the potential VSS and the transistor 122 is turned off. The node PB has a high-level potential based on the potential VDH and the transistor 124 is turned on. The terminal OUT has a low-level potential based on the potential VSS. The terminal OUTB has a high-level potential based on the potential VDD.

A low-level potential is applied to the back gate of the transistor 121, and a high-level potential is applied to the back gate of the transistor 123. As a result, the transistor 121 becomes a normally-off transistor and the transistor 123 becomes a normally-on transistor. Since the transistor 121 can function as a normally-off transistor, a shoot-through current between the wiring VDHL and the wiring VSSL can be surely reduced. Furthermore, since the transistor 123 can function as a normally-on transistor, the amount of current flowing through the gate and the back gate of the transistor 124 can be increased.

In addition, in the configuration in FIG. 10(C), the node PB can have a potential based on the potential VDH, which is higher than the potential VDD. Thus, a voltage applied between the gate and the source of the transistor 124 can be increased and a drop of the amount of threshold voltage in voltage can be made small, so that the potential of the terminal OUTB can be set to the potential VDD more surely.

Figure 11A:
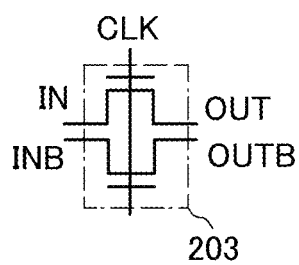
FIG. 11 (A) A circuit diagram, (B) a circuit diagram, (C) a circuit diagram, and (D) a circuit diagram that illustrate configuration examples of a semiconductor device.

The switch circuit 203 illustrated in FIG. 9(C) includes a two-wire switch. Specifically, two transistors that control on and off between the terminal IN and the terminal OUT and between the terminal INB and the terminal OUTB are included. FIG. 11(A) illustrates a circuit symbol of the two-wire switch whose on and off are controlled by the clock signal CLK.

Figure 11B:
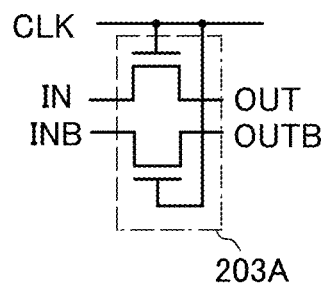

Like a switch circuit 203A illustrated in FIG. 11(B), on and off of the switch circuit 203 illustrated in FIG. 11(A) can be controlled by connecting a wiring for supplying the clock signal CLK and a gate of each transistor.

Figure 11C:
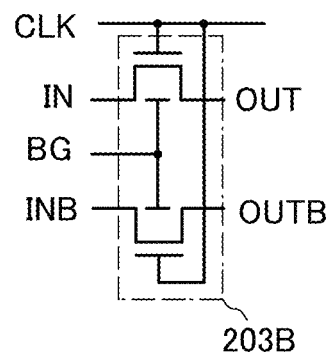

As another configuration, a configuration illustrated in FIG. 11(C) may be employed. A switch circuit 203B illustrated in FIG. 11(C) can have a configuration in which a wiring for supplying a signal BG to a back gate is provided in addition to the wiring for supplying the clock signal CLK, and on and off are controlled in accordance with signals supplied to a gate and the back gate. The signal BG is a signal for supplying a potential for controlling the threshold voltage of a transistor. With such a configuration, control of the threshold voltage of the transistor can be performed as well as control of on and off of the transistor.

Figure 11D:
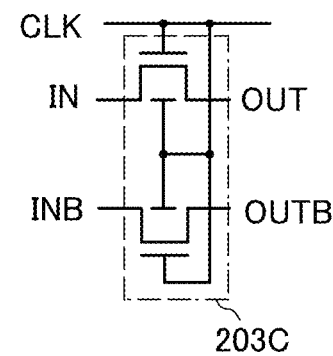

As another configuration, a configuration illustrated in FIG. 11(D) may be employed. On and off of a switch circuit 203C illustrated in FIG. 11(D) can be controlled by connecting a wiring for supplying the clock signal CLK and a gate of each transistor. With such a configuration, the switching characteristics of the transistor can be improved.

With the above-described configuration, a semiconductor device provided with a logic circuit composed of OS transistors can achieve highly reliable operation and can have low power consumption. In addition, a drop in the voltage of the output signal can be suppressed.

Next, a configuration different from the configuration described above will be described.

Figure 12A:
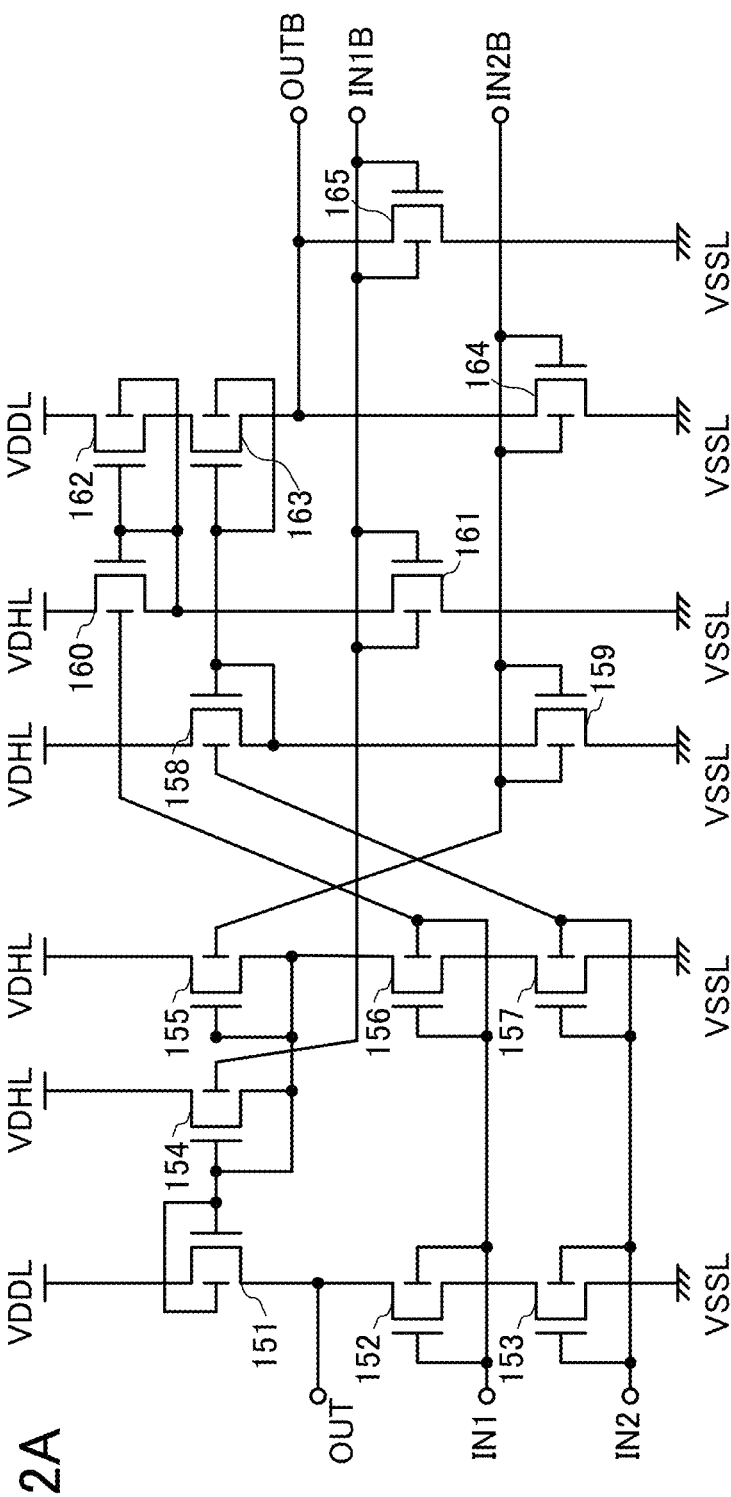
FIG. 12 (A) A circuit diagram and (B) a diagram that illustrate a circuit symbol that illustrate a configuration example of a semiconductor device.

FIG. 12(A) is a circuit diagram of a logic circuit to which the configuration in FIG. 10(B) is applied. A logic circuit 102E illustrated in FIG. 12(A) includes transistors 151 to 165. In addition, the wiring VDHL supplied with the high power supply potential VDH, the wiring VDDL supplied with the high power supply potential VDD, and the wiring VSSL supplied with the low power supply potential VSS are illustrated in FIG. 12(A). Terminals IN1, IN1B, and IN2 and a terminal IN2B are terminals that supply input signals. The terminal OUT and the terminal OUTB are terminals that supply output signals. An output signal corresponding to the negative logical product of the input signals (negative logical sum of the inverted input signals) is obtained from the terminal OUT, and an output signal corresponding to the negative logical product of the input signals (logical product of the inverted input signals) is obtained from the terminal OUTB. The functions of the logic circuit may be switched by interchanging signals input to the terminals. A truth table of the logic circuit illustrated in FIG. 12(A) is the same as Table 1 described in Embodiment 1 described above.

Figure 12B:
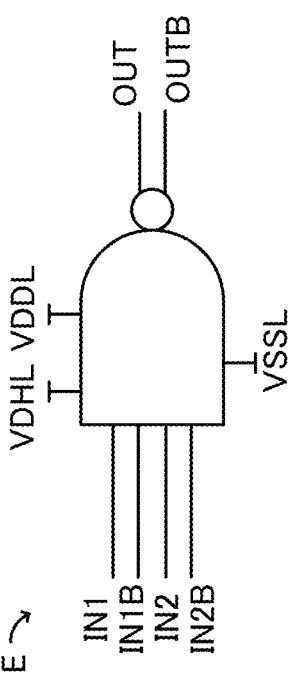

The logic circuit 102D illustrated in FIG. 12(A) represents a two-wire NAND circuit. FIG. 12(B) illustrates a two-wire circuit symbol. Note that wiring names added to FIG. 12(B) are omitted in some cases.

With the use of the above-described combinational circuit, a complicated circuit such as a counter, a serial-parallel converter, or a processor can be provided. These circuits can be composed of OS transistors, and thus can maintain favorable switching characteristics even in a high-temperature environment. Furthermore, owing to a reduction in a shoot-through current, power consumption can be reduced and a drop of the amount of threshold voltage in voltage can be suppressed, for example.

Figure 13A:
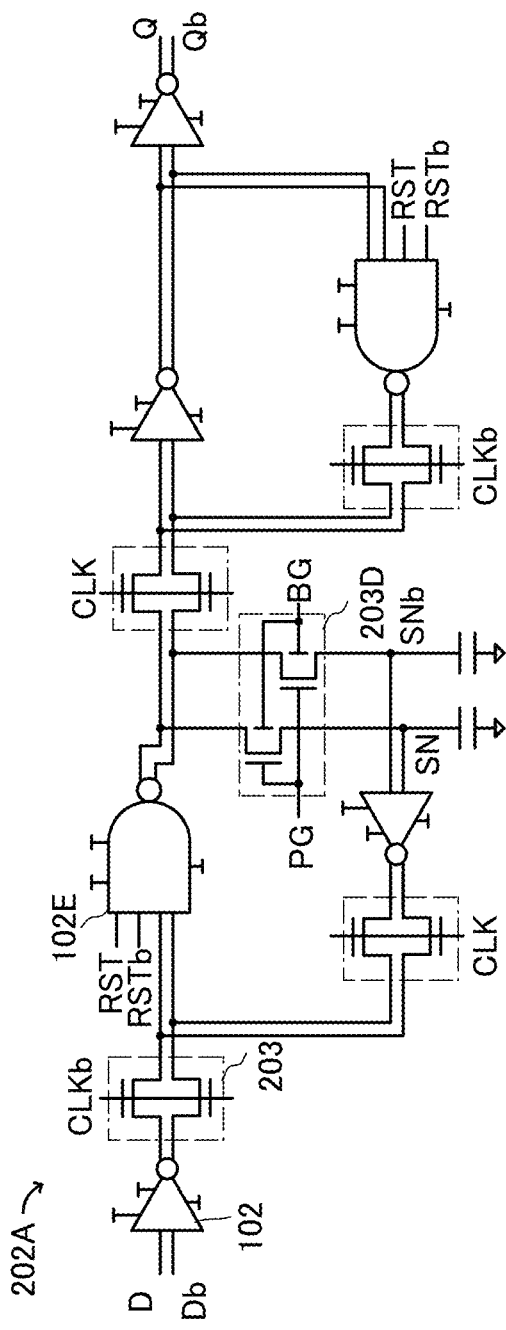
FIG. 13 (A) A circuit diagram and (B) a diagram that illustrate a circuit symbol that illustrate a configuration example of a semiconductor device.

As another configuration example, FIG. 13(A) illustrates a circuit diagram of a logic circuit 202A which can retain data even when supply of a power supply voltage is stopped and thus is capable of power gating. The logic circuit 202A includes, in addition to the logic circuit 102 and the switch circuit 203, the logic circuit 102E to which a reset signal RST and an inverted reset signal RSTb are input and a switch circuit 203D to which a power gating signal PG and the signal BG are supplied.

On and off of the switch circuit 203D are controlled in accordance with the signal PG. The signal PG is a signal for retaining data at the time of power gating. As in other logic circuits, transistors included in the switch circuit 203D are OS transistors. The off-state current of an OS transistor is extremely low. Thus, by turning off the transistors included in the switch circuit 203D, charge corresponding to data supplied to the logic circuit 202A can be retained in a node SN and a node SNb that are illustrated in FIG. 13(A).

Figure 13B:
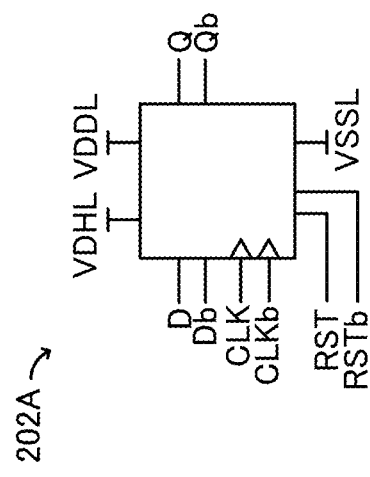

The logic circuit 202A illustrated in FIG. 13(A) functions as an asynchronous-reset-type flip-flop circuit having a power gating function. FIG. 13(B) illustrates a symbol of the circuit in FIG. 13(A).

Figure 14:
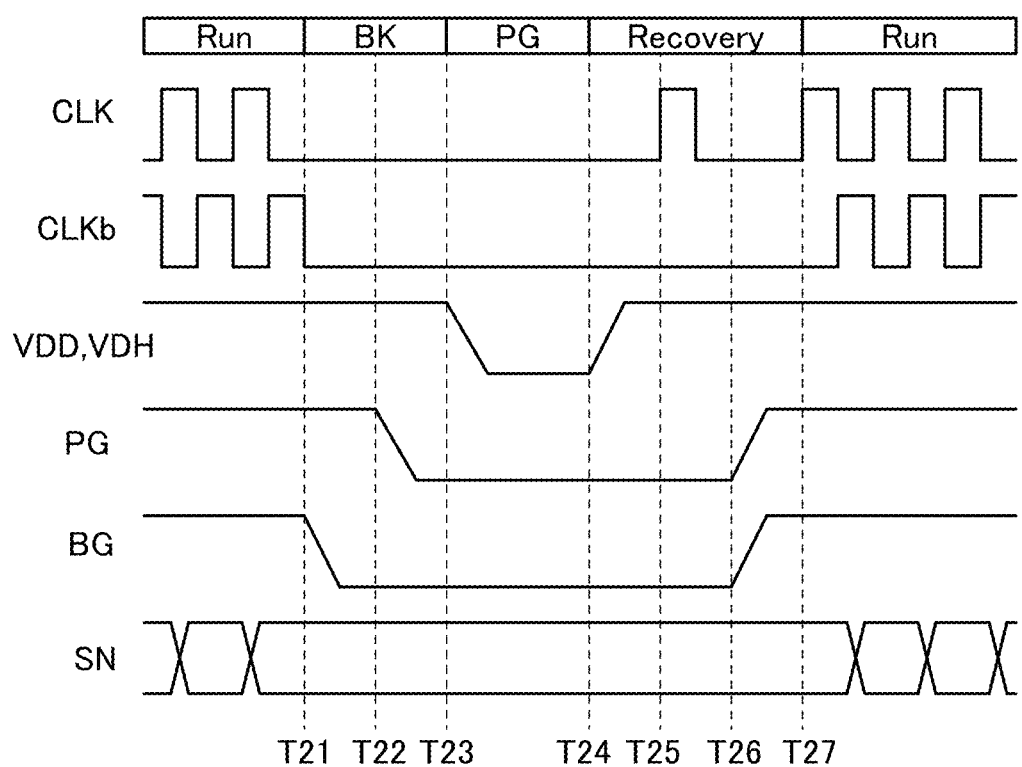
FIG. 14 A timing chart showing a configuration example of a semiconductor device.

Next, the operation of the logic circuit 202A illustrated in FIG. 13(A) is described with reference to FIG. 14. FIG. 14 illustrates a timing chart for describing the operation of the logic circuit 202A illustrated in FIG. 13(A). In FIG. 14, a period for performing signal processing (Run), a period for data backup (BK), a period for power gating (PG), and a period for data recovery (Recovery) are separately shown.

From Time T21 to T22 in the timing chart illustrated in FIG. 14, a signal processing performing state is shifted to a data backup state. At this time, the signal BG is set at a low level to bring the transistors included in the switch circuit 203D into a normally-off state. From Time T22 to T23, the signal PG is set at a low level. Charge corresponding to the data is retained in a capacitor connected to the node SN and the node SNb.

From Time T23 to T24, the voltage VDD and the voltage VDH are set at a low level, whereby a current flowing between power supply lines can be eliminated. During this, the charge corresponding to the data is retained in the capacitor connected to the node SN and the node SNb. Since the signal BG is at a low level, the OS transistor is in a normally-off state. Thus, the charge corresponding to the data is continuously retained in the capacitor connected to the node SN and the node SNb.

From Time T24 to T25, a power gating state is shifted to a data recovery state. At this time, the potentials of the wirings for supplying the voltage VDD and the voltage VDH, which have been set at a low level, are returned to the voltage VDD and the voltage VDH. Since the signal BG is at a low level, the OS transistor is in a normally-off state. Thus, the charge corresponding to the data is continuously retained in the capacitor connected to the node SN and the node SNb.

From Time T25 to T26, the clock signal CLK is set at a high level. Thus, a signal corresponding to the charge corresponding to the data retained in the node SN and the node SNb is output from the logic circuit 102 connected to the node SN and the node SNb to the logic circuit 102E.

From Time T26 to T27, the clock signal CLK is set at a low level and the signal BG and the signal PG are set at a high level. The state is returned to the state just before the data is retained in the node SN and the node SNb. Then, after Time T27, the clock signal CLK and the inverted clock signal CLKb are supplied again, so that signal processing is executed.

The logic circuit 202A includes the above-described logic circuit 102, logic circuit 102E, and the like. Thus, a shoot-through current between the wiring VDHL and the wiring VSSL can be surely reduced.

Figure 15A:
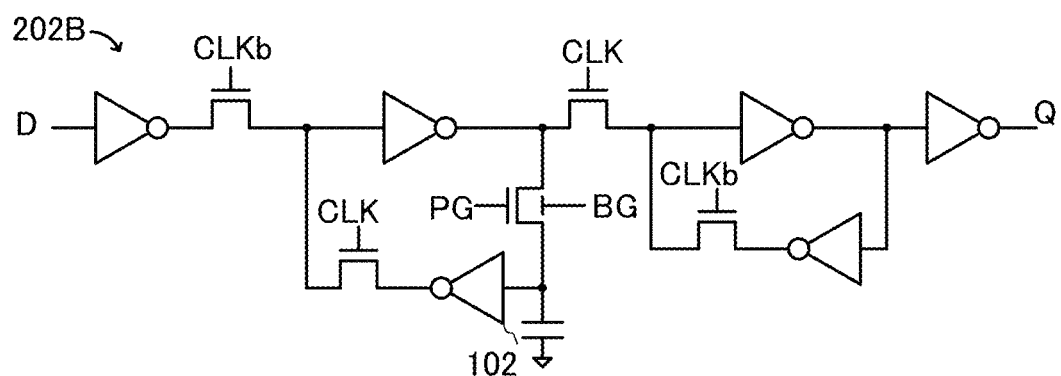
FIG. 15 (A) A circuit diagram and (B) a circuit diagram that illustrate configuration examples of a semiconductor device.
Figure 15B:
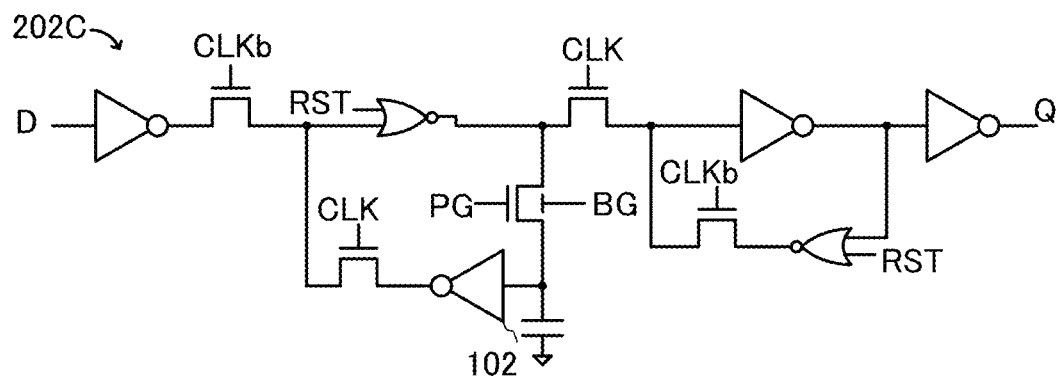

The configuration described with reference to FIG. 13(A) can also be achieved in a circuit diagram illustrated in FIG. 15(A). That is, it can also be achieved in a configuration in which wirings for transmitting the inverted input signal and the inverted output signal are omitted as in a logic circuit 202B. Similarly, it can also be achieved as a configuration in which a NAND circuit is replaced with a NOR circuit as in a circuit diagram of a logic circuit 202C illustrated in FIG. 15(B).

Figure 16:
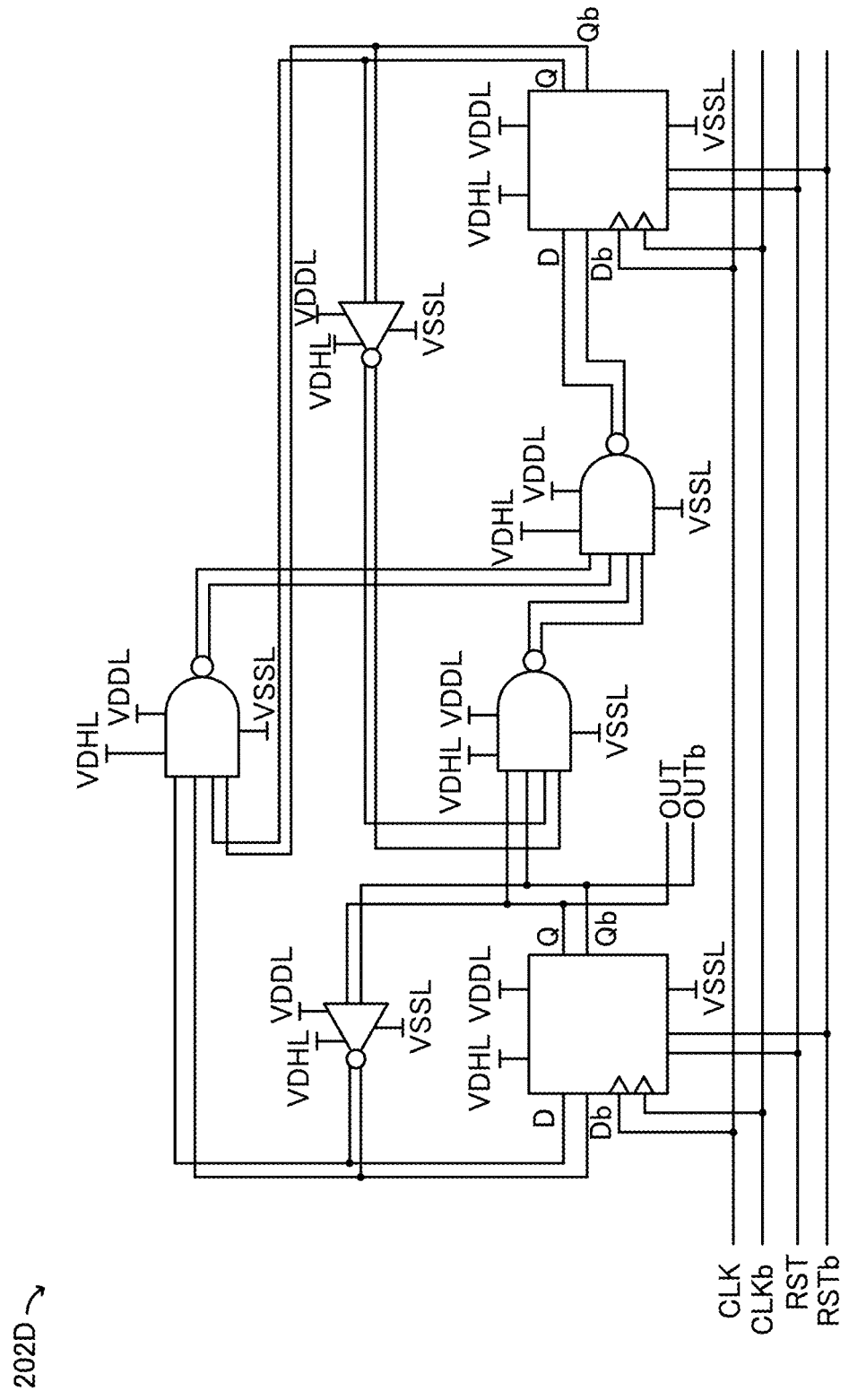
FIG. 16 A circuit diagram illustrating a configuration example of a semiconductor device.

As another configuration example, a logic circuit 202D illustrated in FIG. 16 is a circuit diagram of a configuration example of a 2-bit counter (with an asynchronous reset function) to which the above-described logic circuit is applied. The circuit configuration illustrated in FIG. 16 can be achieved by combining the above-described logic circuits having different functions.

The structure, method, and the like described above in this embodiment can be used in combination as appropriate with the structures, methods, and the like described in the other embodiments.

Embodiment 3

In this embodiment, an example of a structure of an OS transistor that can be used in the semiconductor device described in the above embodiment will be described.

<Transistor Structure Example>

Figure 17A:
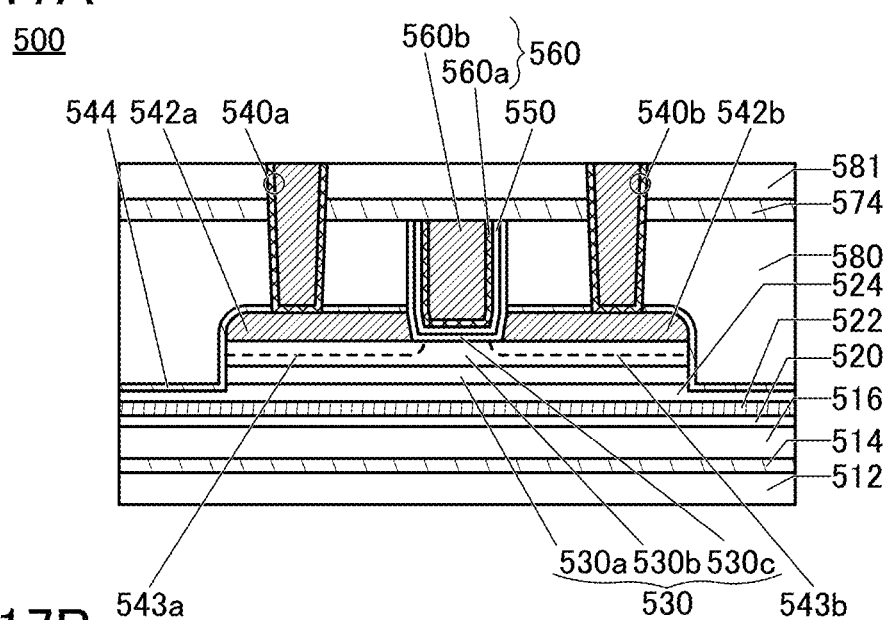
FIG. 17 (A) A cross-sectional view and (B) a cross-sectional view that illustrate a structure example of a transistor.
Figure 17B:
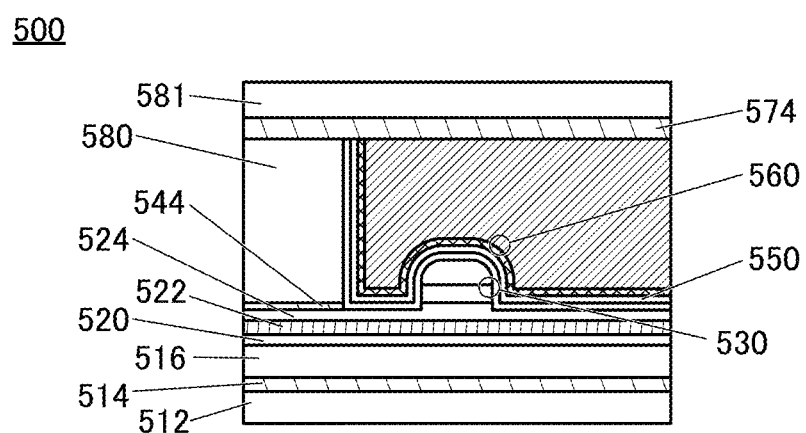

FIGS. 17(A) to 17(C) are cross-sectional views of a transistor 500 that is an OS transistor illustrated as an example. FIG. 17(A) is a cross-sectional view of the transistor 500 in the channel length direction, and FIG. 17(B) is a cross-sectional view of the transistor 500 in the channel width direction.

The transistor 500 is a transistor containing a metal oxide in a channel formation region (OS transistor). The transistor 500 can have favorable switching characteristics even in a high-temperature environment, for example, at 200° C., and thus a semiconductor device having excellent reliability even in a high-temperature environment can be provided. In addition, since an off-state current can be reduced, a semiconductor device having reduced power consumption even in a high-temperature environment can be provided.

In the cross-sectional views illustrated in FIGS. 17(A) and 17(B), an insulator 512, an insulator 514, and an insulator 516 are stacked in this order. A substance having a barrier property against oxygen or hydrogen is preferably used for one of the insulator 512, the insulator 514, and the insulator 516.

For example, for the insulator 514, it is preferable to use a film having a barrier property so as to prevent hydrogen and impurities from being diffused from the substrate in the lower layer, for example, into the region where the transistor 500 is provided.

For the film having a barrier property against hydrogen, silicon nitride formed by a CVD method can be used, for example. As the film having a barrier property against hydrogen, a metal oxide such as aluminum oxide, hafnium oxide, or tantalum oxide is preferably used for the insulator 514, for example.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

For the insulator 512 and the insulator 516, for example, an interlayer film of a material with a relatively low permittivity is used, whereby the parasitic capacitance generated between wirings can be reduced. Silicon oxide films, silicon oxynitride films, or the like can be used as the insulator 512 and the insulator 516, for example.

The transistor 500 is provided above the insulator 516.

As illustrated in FIGS. 17(A) and 17(B), the transistor 500 includes an insulator 520 positioned over the insulator 516; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542*a* and the conductor 542*b* and is provided with an opening formed to overlap with a region between the conductor 542*a* and the conductor 542*b*; a conductor 560 positioned in the opening; an insulator 550 positioned between the conductor 560 and the oxide 530*b*, the conductor 542*a*, the conductor 542*b*, and the insulator 580; and an oxide 530*c* positioned between the insulator 550 and the oxide 530*b*, the conductor 542*a*, the conductor 542*b*, and the insulator 580.

As illustrated in FIGS. 17(A) and 17(B), an insulator 544 is preferably positioned between the insulator 580 and the oxide 530*a*, the oxide 530*b*, the conductor 542*a*, and the conductor 542*b*. In addition, as illustrated in FIGS. 17(A) and 17(B), the conductor 560 preferably includes a conductor 560*a* provided inside the insulator 550 and a conductor 560*b* embedded inside the conductor 560*a*. Moreover, as illustrated in FIGS. 17(A) and 17(B), an insulator 574 is preferably positioned over the insulator 580, the conductor 560, and the insulator 550.

Hereinafter, the oxide 530*a*, the oxide 530*b*, and the oxide 530*c* may be collectively referred to as an oxide 530. The conductor 542*a* and the conductor 542*b* may be collectively referred to as a conductor 542.

The transistor 500 has a structure in which three layers of the oxide 530*a*, the oxide 530*b*, and the oxide 530*c* are stacked in the region where the channel is formed and its vicinity; however, the present invention is not limited thereto. For example, a single layer of the oxide 530*b*, a two-layer structure of the oxide 530*b* and the oxide 530*a*, a two-layer structure of the oxide 530*b* and the oxide 530*c*, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIGS. 17(A) and 17(B) is an example, and the structure is not limited thereto; an appropriate transistor can be used in accordance with a circuit configuration or a driving method.

Here, the conductor 560 functions as a gate electrode of the transistor, and the conductor 542*a* and the conductor 542*b* function as a source electrode and a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping the conductor 542*a* or the conductor 542*b*. Thus, parasitic capacitance formed between the conductor 560 and each of the conductor 542*a* and the conductor 542*b* can be reduced. As a result, the transistor 500 can have improved switching speed and excellent frequency characteristics.

The insulator 550 has a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 524 includes an excess-oxygen region, it is preferred that the insulator 522 have a function of inhibiting diffusion of oxygen (e.g., an oxygen atom, an oxygen molecule, or the like) (the oxygen is less likely to pass).

When the insulator 522 has a function of inhibiting diffusion of oxygen or impurities, oxygen contained in the oxide 530 is not diffused to the insulator 520 side, which is preferable.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba, Sr)TiO$_3$ (BST). As miniaturization and high integration of transistors progress, a problem such as leakage current may arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride are thermally stable; thus, when an insulator which is a high-k material and the insulator 520 are combined, a stacked-layer structure that has thermal stability and a high dielectric constant can be obtained.

Note that the insulator 520, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used for the oxide 530a is preferably greater than the atomic ratio of the element M to the constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 17(A), a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. The channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when an oxidation-resistant material or a material that does not significantly lose its conductivity even after absorbing oxygen is used for the conductor 542. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. An oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy analysis (TDS analysis) is used, for example. Note that the temperature of the film surface in the TDS analysis is preferably higher than or equal to 100° C. and lower than or equal to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as the gate electrode has a two-layer structure in FIGS. 17(A) and 17(B), a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to prevent a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used.

The conductor 560b is preferably formed using a conductive material containing tungsten, copper, or aluminum as its main component. The conductor 560b also functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably lowered.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The conductor 540a and the conductor 540b have a function of a plug or a wiring that is connected to the transistor 500.

With the use of this structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided. Alternatively, a semiconductor device using a transistor including an oxide semiconductor can be miniaturized or highly integrated.

Note that the structure of the transistor 500 in the semiconductor device described in this embodiment is not limited to the above. Examples of structures that can be used for the transistor 500 will be described below.

Transistor Structure Example 1

Figure 18A:
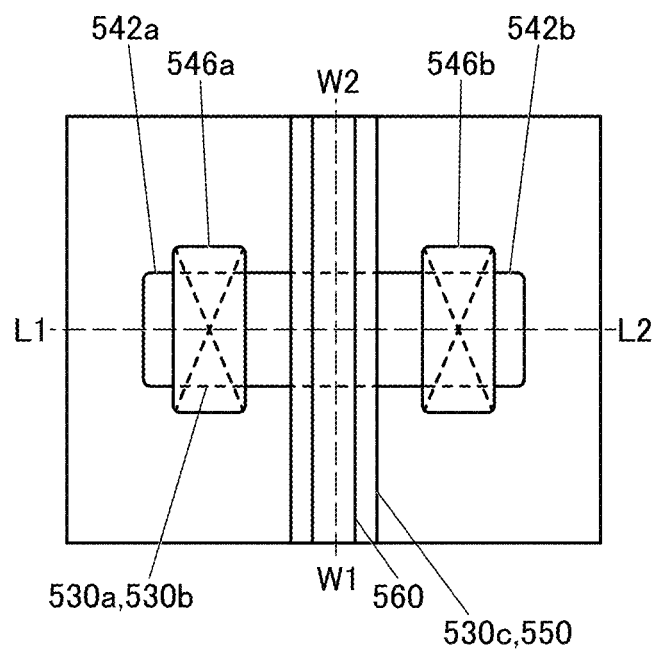
FIG. 18 (A) A top view, (B) a cross-sectional view, and (C) a cross-sectional view that illustrate a structure example of a transistor.
Figure 18C:
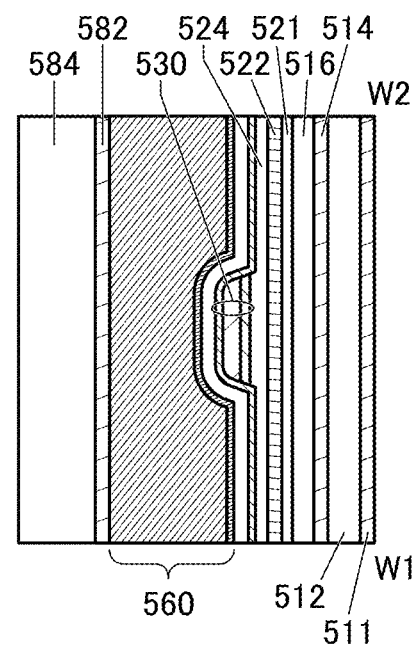
Figure 18B:
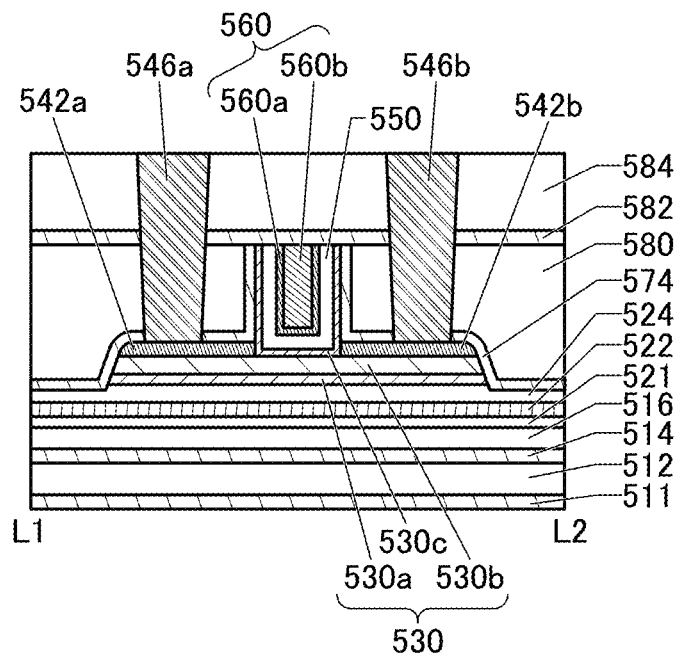

A structure example of a transistor 510A is described with reference to FIGS. 18(A), 18(B), and 18(C). FIG. 18(A) is a top view of the transistor 510A. FIG. 18(B) is a cross-sectional view of a portion indicated by a dashed-dotted line L1-L2 in FIG. 18(A). FIG. 18(C) is a cross-sectional view of a portion indicated by a dashed-dotted line W1-W2 in FIG. 18(A). Note that for clarification of the drawing, some components are not illustrated in the top view of FIG. 18(A).

FIGS. 18(A), 18(B), and 18(C) illustrate a transistor 510A and the insulator 511, the insulator 512, the insulator 514, the insulator 516, the insulator 580, the insulator 582, and an insulator 584 that function as interlayer films. In addition, a conductor 546 (a conductor 546a and a conductor 546b) that is electrically connected to the transistor 510A and functions as a contact plug is illustrated.

The transistor 510A includes the conductor 560 (the conductor 560a and the conductor 560b) functioning as a gate electrode; the insulator 550 functioning as a gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIGS. 18(A), 18(B), and 18(C), the oxide 530c, the insulator 550, and the conductor 560 are positioned in an opening provided in the insulator 580 with the insulator 574 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of an oxygen atom, an oxygen molecule, and the like) (through which the above oxygen does not easily pass). Moreover, aluminum oxide or silicon nitride, for example, may be used for the insulator 511. This structure can inhibit diffusion of impurities such as hydrogen and water to the transistor 510A side from the substrate side of the insulator 511.

For example, the dielectric constant of the insulator 512 is preferably lower than that of the insulator 511. When a material with a low dielectric constant is used for the interlayer film, the parasitic capacitance generated between wirings can be reduced.

In the transistor 510A, the conductor 560 sometimes functions as a gate electrode.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side of the insulator 514. Moreover, for example, the insulator 516 preferably has a lower dielectric constant than the insulator 514. When a material with a low dielectric constant is used for the interlayer film, the parasitic capacitance generated between wirings can be reduced.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating film. When a high-k material is used for an insulator functioning as the gate insulating film, a gate potential during operation of the transistor can be reduced while the physical thickness is maintained.

For example, it is preferable that the insulator 521 be thermally stable. For example, silicon oxide and silicon oxynitride are thermally stable, so that a combination of an insulator of a high-k material and the insulator 522 achieves a stacked-layer structure with thermal stability and a high dielectric constant.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one kind of metal oxide, can be used.

Note that the oxide 530c is preferably provided in the opening in the insulator 580 with the insulator 574 positioned therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is shown in FIGS. 18(A), 18(B), and 18(C), a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductor 542. The barrier layer is preferably formed using a material having a barrier property against oxygen or hydrogen. This structure can inhibit oxidation of the conductor 542 at the time of deposition of the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a gate insulating film. The insulator 550 is preferably provided in the opening in the insulator 580 with the oxide 530c and the insulator 574 positioned therebetween.

As miniaturization and high integration of transistors progress, a problem such as leakage current may arise because of thinner gate insulating films. In that case, the insulator 550 may have a stacked-layer structure. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductor 560 functioning as a gate electrode includes the conductor 560a and the conductor 560b over the conductor 560a. The conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like). Note that in this specification, a function of inhibiting diffusion of impurities or oxygen means a function of inhibiting diffusion of any one or all of the above impurities and the above oxygen.

When the conductor 560a has a function of inhibiting diffusion of oxygen, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. The conductor 560 functions as a wiring and thus is preferably formed using a conductor having high conductivity. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower dielectric constant than the insulator 582. When a material with a low dielectric constant is used for the interlayer films, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and has a high on-state current can be provided. Alternatively, a semiconductor device including a transistor that contains an oxide semiconductor and has a low off-state current can be provided. Alternatively, a semiconductor device that has small variations in electrical characteristics, stable electrical characteristics, and high reliability can be provided.

Transistor Structure Example 2

Figure 19A:
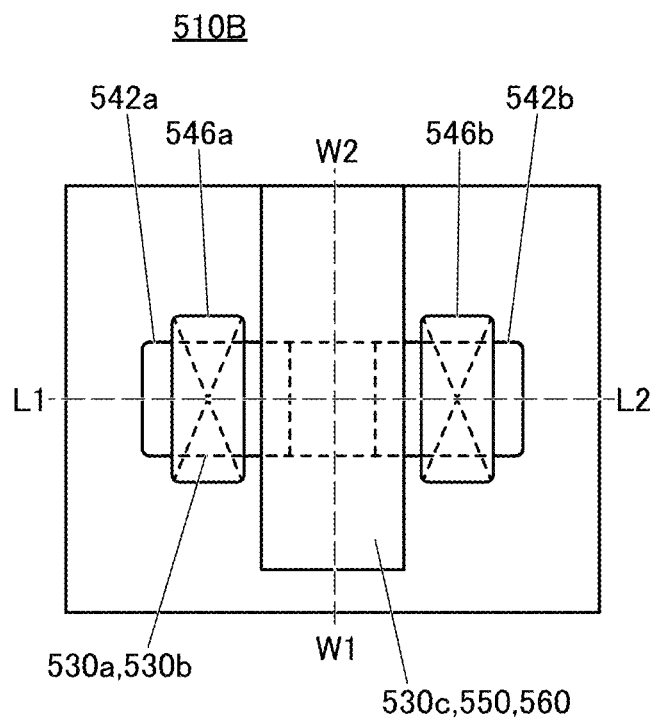
FIG. 19 (A) A top view, (B) a cross-sectional view, and (C) a cross-sectional view that illustrate a structure example of a transistor.
Figure 19C:
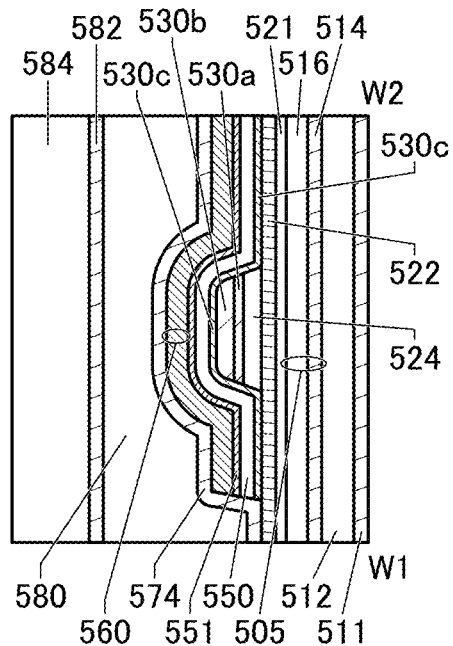
Figure 19B:
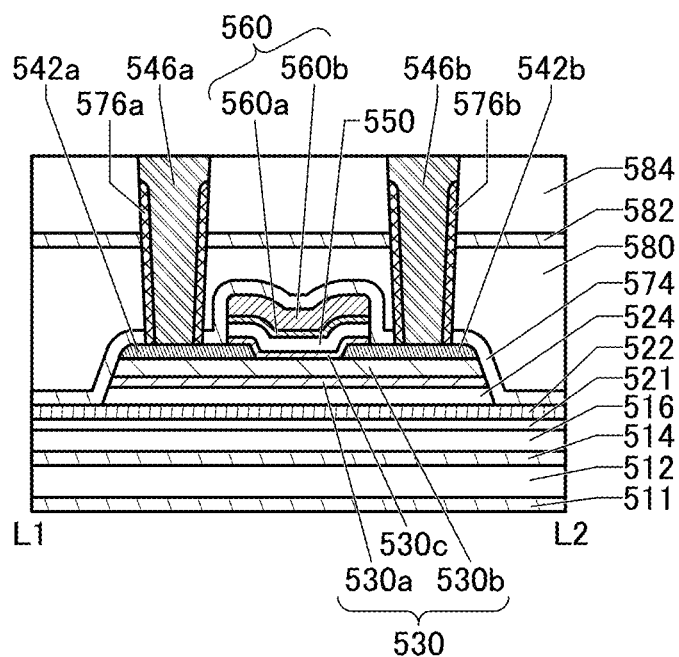

A structure example of a transistor 510B is described with reference to FIGS. 19(A), 19(B), and 19(C). FIG. 19(A) is a top view of the transistor 510B. FIG. 19(B) is a cross-sectional view of a portion indicated by a dashed-dotted line L1-L2 in FIG. 19(A). FIG. 19(C) is a cross-sectional view of a portion indicated by a dashed-dotted line W1-W2 in FIG. 19(A). Note that for clarification of the drawing, some components are not illustrated in the top view of FIG. 19(A).

The transistor 510B is a variation example of the transistor 510A. Therefore, differences from the transistor 510A will be mainly described to avoid repeated description.

The transistor 510B includes a region where the conductor 542 (the conductor 542a and the conductor 542b), the oxide 530c, the insulator 550, and the conductor 560 overlap with each other. With this structure, a transistor having a high on-state current can be provided. Moreover, a transistor having high controllability can be provided.

The conductor 560 functioning as a gate electrode includes the conductor 560a and the conductor 560b over the conductor 560a. The conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting diffusion of oxygen, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and the side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

Transistor Structure Example 3

Figure 20A:
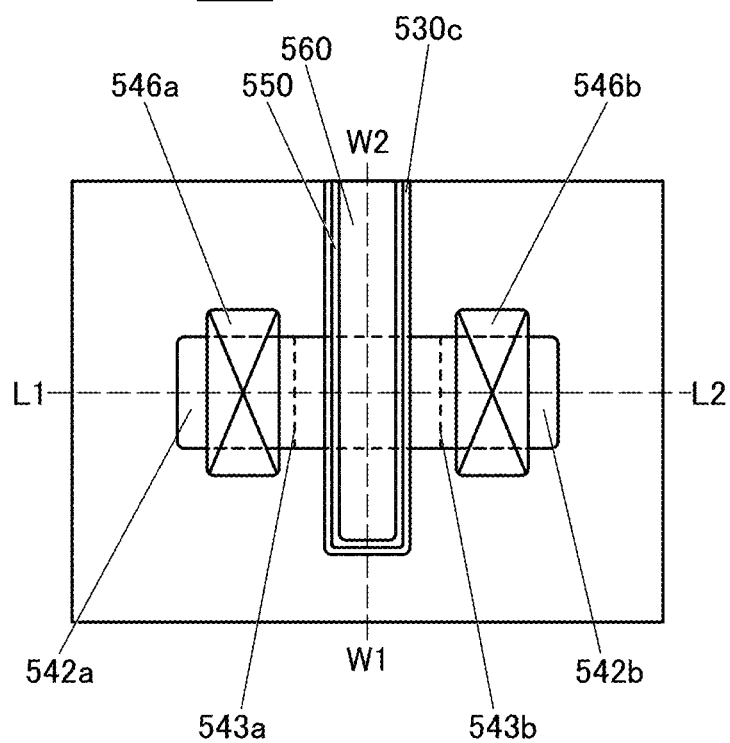
FIG. 20 (A) A top view, (B) a cross-sectional view, and (C) a cross-sectional view that illustrate a structure example of a transistor.
Figure 20C:
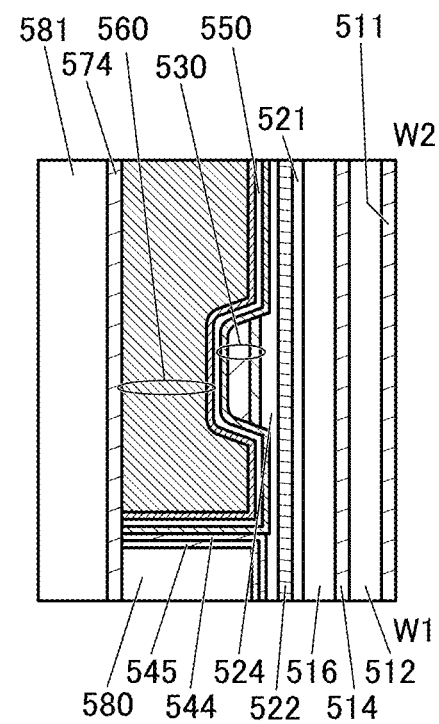
Figure 20B:
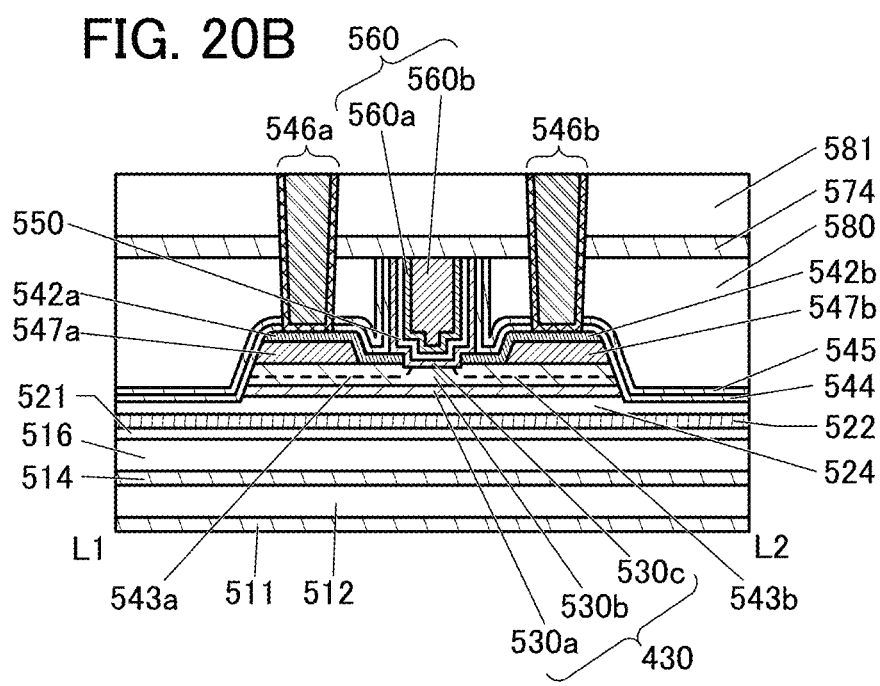

A structure example of a transistor 510C is described with reference to FIGS. 20(A), 20(B), and 20(C). FIG. 20(A) is a top view of the transistor 510C. FIG. 20(B) is a cross-sectional view of a portion indicated by a dashed-dotted line L1-L2 in FIG. 20(A). FIG. 20(C) is a cross-sectional view of a portion indicated by a dashed-dotted line W1-W2 in FIG. 20(A). Note that for clarification of the drawing, some components are not illustrated in the top view of FIG. 20(A).

The transistor 510C is a variation example of the transistor 510A. Therefore, differences from the transistor 510A will be mainly described to avoid repeated description.

In the transistor 510C illustrated in FIGS. 20(A), 20(B), and 20(C), a conductor 547a is positioned between the conductor 542a and the oxide 530b and a conductor 547b is positioned between the conductor 542b and the oxide 530b. Here, the conductor 542a (the conductor 542b) has a region that extends beyond the top surface and a side surface on the conductor 560 side of the conductor 547a (the conductor 547b) and is in contact with the top surface of the oxide 530b. For the conductor 547, a conductor that can be used for the conductor 542 is used. It is preferred that the thickness of the conductor 547 be at least greater than that of the conductor 542.

In the transistor 510C illustrated in FIGS. 20(A), 20(B), and 20(C), because of the above structure, the conductor 542 can be closer to the conductor 560 than in the transistor 510A. Alternatively, the conductor 560 and an end portion of the conductor 542a and an end portion of the conductor 542b can overlap with each other. Accordingly, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIGS. 20(A), 20(B), and 20(C) may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 544 can be formed using an insulator that can be used for the insulator 545. In addition, the insulator 544 may be formed using a nitride insulator such as aluminum nitride, aluminum titanium nitride, titanium nitride, silicon nitride, or silicon nitride oxide, for example.

Transistor Structure Example 4

Figure 21A:
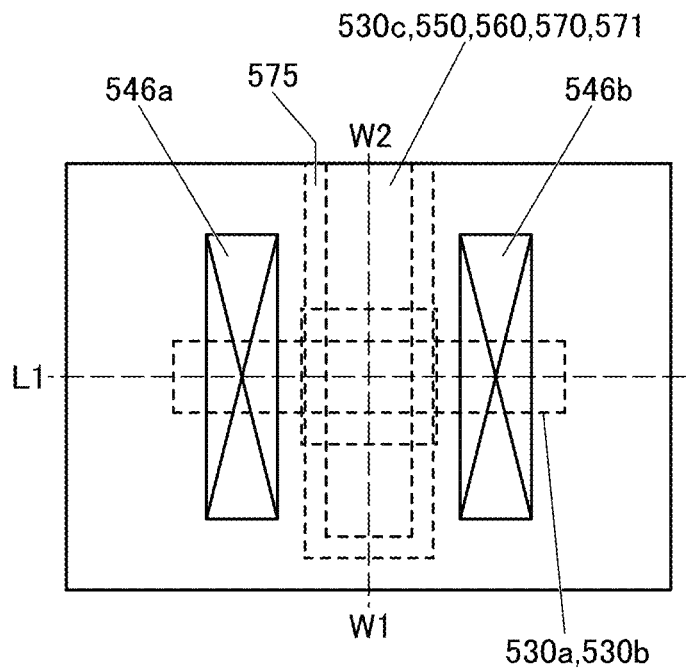
FIG. 21 (A) A top view, (B) a cross-sectional view, and (C) a cross-sectional view that illustrate a structure example of a transistor.
Figure 21C:
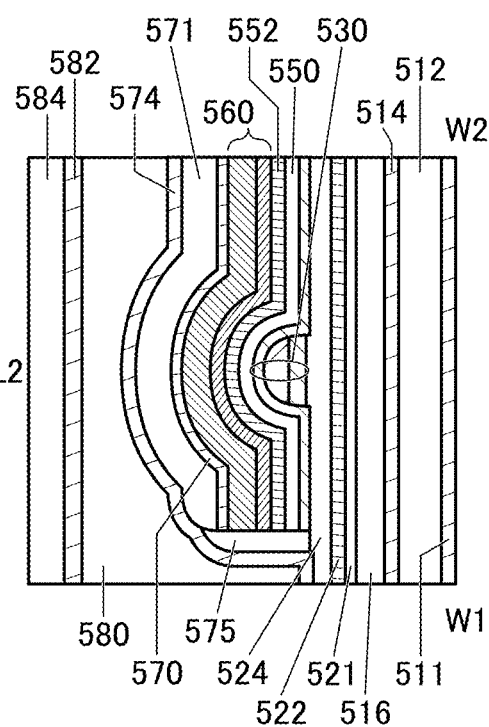
Figure 21B:
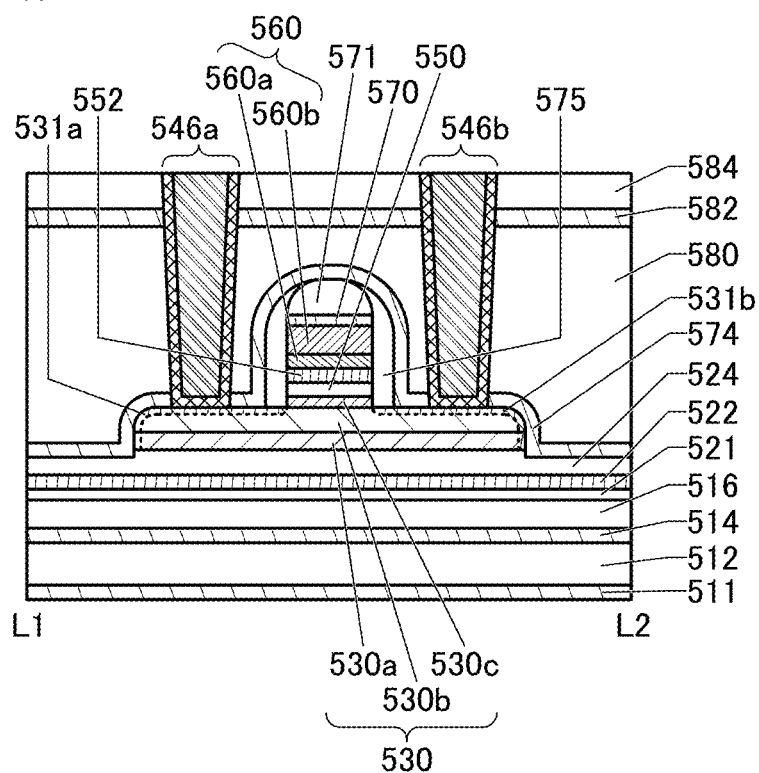

A structure example of a transistor 510D is described with reference to FIGS. 21(A), 21(B), and 21(C). FIG. 21(A) is a top view of the transistor 510D. FIG. 21(B) is a cross-sectional view of a portion indicated by a dashed-dotted line L1-L2 in FIG. 21(A). FIG. 21(C) is a cross-sectional view of a portion indicated by a dashed-dotted line W1-W2 in FIG. 21(A). Note that for clarification of the drawing, some components are not illustrated in the top view of FIG. 21(A).

The transistor 510D is a variation example of the above transistors. Therefore, differences from the above transistors will be mainly described to avoid repeated description.

In FIGS. 21(A) to 21(C), the insulator 550 is provided over the oxide 530c and a metal oxide 552 is provided over the insulator 550. The conductor 560 is provided over the metal oxide 552, and an insulator 570 is provided over the conductor 560. An insulator 571 is provided over the insulator 570.

The metal oxide 552 preferably has a function of inhibiting diffusion of oxygen. When the metal oxide 552 that inhibits diffusion of oxygen is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be suppressed.

Note that the metal oxide 552 may function as part of a gate. For example, an oxide semiconductor that can be used for the oxide 530 can be used for the metal oxide 552. In this case, when the conductor 560 is deposited by a sputtering method, the metal oxide 552 can have a reduced electric resistance to be a conductive layer. This can be referred to as an OC (Oxide Conductor) electrode.

Note that the metal oxide 552 functions as part of a gate insulating film in some cases. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied during operation of the transistor can be reduced while the physical thickness is maintained. In addition, the equivalent oxide thickness (EOT) of the insulating layer functioning as the gate insulating film can be reduced.

Although the metal oxide 552 in the transistor 510D is shown as a single layer, a stacked-layer structure of two or more layers may be employed. For example, a metal oxide functioning as part of a gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential component. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidization of the conductor 560 due to oxygen from above the insulator 570 can be inhibited. Moreover, entry of impurities such as water and hydrogen from above the insulator 570 into an oxide 230 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a surface of the substrate can be greater than or equal to 75° and less than or equal to 100°, preferably greater than or equal to 80° and less than or equal to 95°.

An insulating material having a function of inhibiting the passage of oxygen and impurities such as water and hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to "impurity regions" or "low-resistance regions".

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride, which have thermal stability, are preferable. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water and hydrogen can be deposited. For example, aluminum oxide is preferably used for the insulator 574.

Note that an oxide film obtained by a sputtering method may extract hydrogen from the structure body over which the oxide film is deposited. Thus, the hydrogen concentration in the oxide 230 and the insulator 575 can be reduced when the insulator 574 absorbs hydrogen and water from the oxide 230 and the insulator 575.

Transistor Structure Example 5

Figure 22A:
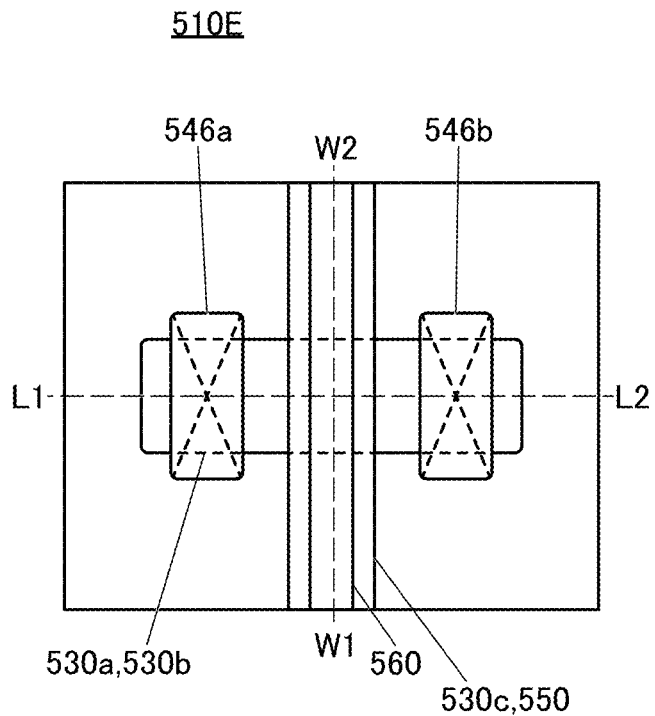
FIG. 22 (A) A top view, (B) a cross-sectional view, and (C) a cross-sectional view that illustrate a structure example of a transistor.
Figure 22C:
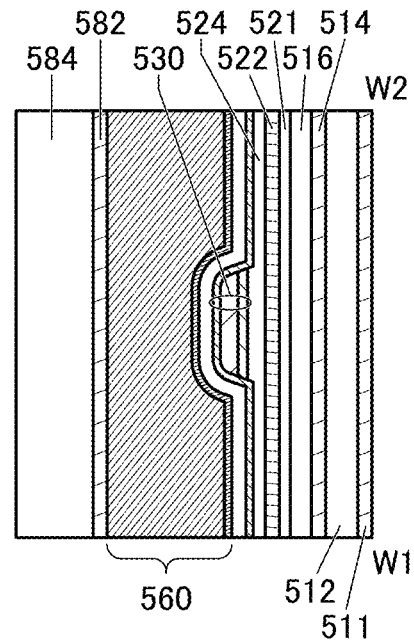
Figure 22B:
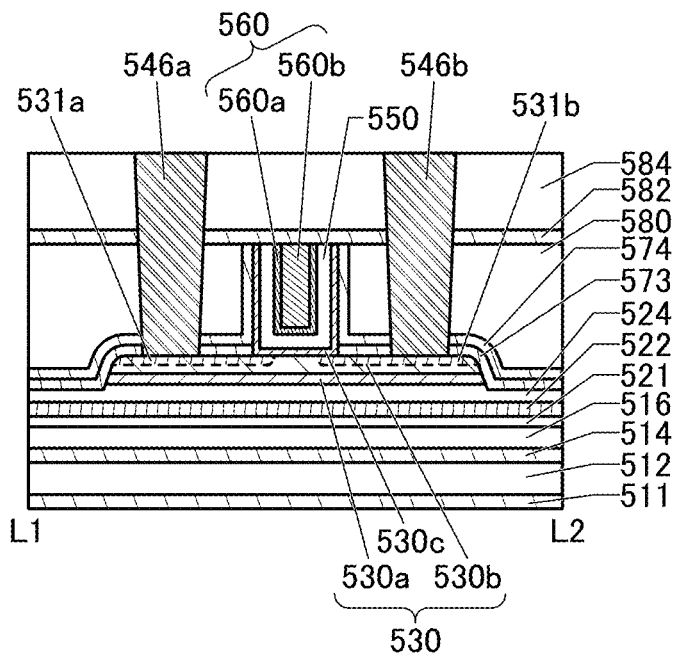

A structure example of a transistor 510E is described with reference to FIG. 22(A) to FIG. 22(C). FIG. 22(A) is a top view of the transistor 510E. FIG. 22(B) is a cross-sectional view of a portion indicated by a dashed-dotted line L1-L2 in FIG. 22(A). FIG. 22(C) is a cross-sectional view of a portion indicated by a dashed-dotted line W1-W2 in FIG. 22(A). Note that for clarification of the drawing, some components are not illustrated in the top view of FIG. 22(A).

The transistor 510E is a variation example of the above transistors. Therefore, differences from the above transistors will be mainly described to avoid repeated description.

In FIGS. 22(A) to 22(C), the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIGS. 22(A) to 22(C) are regions where an element described below is added to the oxide 530b. The regions 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the region 531, the oxide 530c, and the insulator 550 overlap with each other.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening provided in the insulator 580, and the region 531 provided in the oxide 530b is partly exposed at the bottom surface of the opening. Next, an oxide film to be the oxide 530c, an insulating film to be the insulator 550, and a conductive film to be the conductor 560 are formed in this order in the opening, and then an oxide film to be the oxide 530c, an insulating film to be the insulator 550, and a conductive film to be the conductor 560 are partly removed by CMP treatment or the like until the insulator 580 is exposed; thus, the transistor illustrated in FIG. 22(A) to FIG. 22(C) can be formed.

Note that the insulator 573 and the insulator 574 are not essential components. Design is appropriately set in consideration of required transistor characteristics.

The cost of the transistor illustrated in FIG. 22(A) to FIG. 22(C) can be reduced because an existing apparatus can be used and the conductor 542 is not provided.

Note that this embodiment can be implemented in combination with the other embodiments described in this specification as appropriate.

Embodiment 4

In this embodiment, an example of an electronic device that can use the semiconductor device described in the above embodiment is described.

The semiconductor device according to one embodiment of the present invention can be provided in a variety of electronic devices. In particular, the semiconductor device according to one embodiment of the present invention can be used as an IC for a control processor in an electronic device expected to be used in a high-temperature environment. Examples of the electronic device include, in addition to a moving object such as a vehicle, a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

FIG. 23(A) to FIG. 23(D) show examples of electronic devices.

Figure 23A:
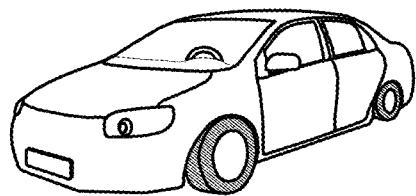
FIG. 23 (A)-(D) Diagrams illustrating structure examples of electronic devices.

FIG. 23(A) is a diagram illustrating an automobile 5700 which is an example of a moving object. The semiconductor device described in the above embodiment can be used for a control system that controls a device such as a sensor or an actuator in the automobile 5700.

Figure 23B:
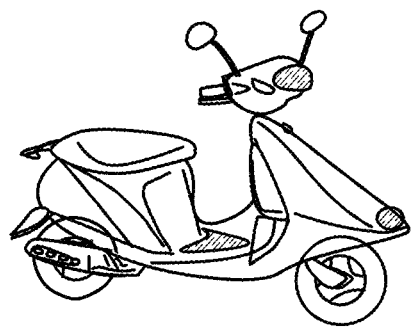

FIG. 23(B) is a diagram illustrating an electric motorcycle 5800 which is an example of a moving object. The semiconductor device described in the above embodiment can be used for a control system that controls a device such as a sensor or an actuator or a battery management system in the electric motorcycle 5800.

Although an automobile and an electric motorcycle are described above as examples of a moving object, moving objects are not limited to an automobile and an electric motorcycle. Examples of moving objects include a train, a monorail train, a ship, and a flying object (a helicopter, an unmanned aircraft (a drone), an airplane, and a rocket), and these moving objects can include the semiconductor device according to one embodiment of the present invention.

Figure 23C:
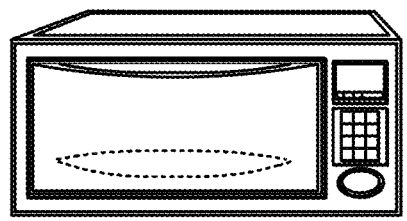

FIG. 23(C) illustrates a microwave oven 5900 which is an example of an electronic device. The semiconductor device described in the above embodiment can be used for, for example, a control IC that controls a power device for making a current flow in the microwave oven 5900.

Figure 23D:
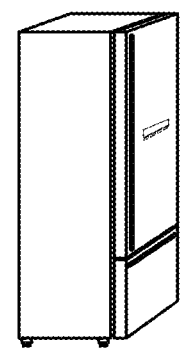

FIG. 23(D) illustrates an electric refrigerator-freezer 6000 which is an example of an electronic device. The semiconductor device described in the above embodiment can be used for, for example, a control IC that controls a power device for making a current flow in the electric refrigerator-freezer 6000.

The semiconductor device according to one embodiment of the present invention enables highly reliable operation and low power consumption even in a high-temperature environment. Moreover, power consumption of an electronic device can be reduced.

Note that this embodiment can be implemented in combination with the other embodiments described in this specification as appropriate.

(Supplementary Notes on the Description in this Specification and the Like)

The description of the above embodiments and the structures in the embodiments are noted below.

One embodiment of the present invention can be constituted by combining, as appropriate, the structure described in an embodiment with any of the structures described in the other embodiments. In addition, in the case where a plurality of structure examples are described in one embodiment, some of the structure examples can be combined as appropriate.

Note that a content (or part of the content) described in an embodiment can be applied to, combined with, or replaced with another content (or part of the content) described in the embodiment and/or a content (or part of the content) described in another embodiment or other embodiments.

Note that in each embodiment, a content described in the embodiment is a content described with reference to a variety of diagrams or a content described with text in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, blocks in the block diagrams are not limited by any of the components described in the specification, and the description can be changed appropriately depending on the circumstance.

In the drawings, the size, the layer thickness, or the region is shown with given magnitude for description convenience. Therefore, they are not necessarily limited to the illustrated scale. Note that the drawings are schematically shown for clarity, and embodiments of the present invention are not limited to shapes, values or the like shown in the drawings. For example, the following can be included: variation in signal, voltage, or current due to noise or variation in signal, voltage, or current due to difference in timing.

In this specification and the like, expressions "one of a source and a drain" (or a first electrode or a first terminal) and "the other of the source and the drain" (or a second electrode or a second terminal) are used in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like appropriately depending on the circumstance.

Furthermore, in this specification and the like, the term "electrode" or "wiring" does not functionally limit the component. For example, an "electrode" is used as part of a "wiring" in some cases, and vice versa. Moreover, the term "electrode" or "wiring" also includes the case where a plurality of "electrodes" or "wirings" are formed in an integrated manner, for example.

Furthermore, in this specification and the like, voltage and potential can be interchanged with each other as appropriate. The voltage refers to a potential difference from a reference potential, and when the reference potential is a ground voltage, for example, the voltage can be rephrased into the potential. The ground potential does not necessarily mean 0 V. Potentials are relative values, and the potential applied to a wiring or the like is changed depending on the reference potential, in some cases.

Note that in this specification and the like, the terms such as "film" and "layer" can be interchanged with each other depending on the case or circumstances. For example, the term "conductive layer" can be changed into the term "conductive film" in some cases. Furthermore, for example, the term "insulating film" can be changed into the term "insulating layer" in some cases.

In this specification and the like, a switch has a function of determining whether to flow current or not by being in a conduction state (on state) or a non-conduction state (off state). Alternatively, a switch has a function of selecting and changing a current path.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap with each other or a region where a channel is formed.

In this specification and the like, when A and B are connected, it means the case where A and B are electrically connected to each other as well as the case where A and B are directly connected to each other. Here, when A and B are electrically connected, it means the case where electric signals can be sent and received between A and B when an object having any electric action exists between A and B.

REFERENCE NUMERALS

IN1: terminal, IN2B: terminal, L1-L2: dashed-dotted line, T1: time, T2: time, T3: time, T4: time, T5: time, T6: time, T7: time, T8: time, T11: time, T12: time, T13: time, T14: time, T21: time, T22: time, T23: time, T24: time, T25: time, T26: time, T27: time, 100: semiconductor device, 100A: semiconductor device, 101: signal generation circuit, 102: logic circuit, 102B: logic circuit, 102C: logic circuit, 102D: logic circuit, 102E: logic circuit, 111: transistor, 112: transistor, 113: transistor, 114: transistor, 115: transistor, 121: transistor, 122: transistor, 123: transistor, 124: transistor, 125: transistor, 126: transistor, 127: transistor, 128: transistor, 131: transistor, 138: transistor, 151: transistor, 165: transistor, 201: signal processing circuit, 202: logic circuit, 202A: logic circuit, 202B: logic circuit, 202C: logic circuit, 202D: logic circuit, 203: switch circuit, 203A: switch circuit, 203B: switch circuit, 203C: switch circuit, 203D: switch circuit, 230: oxide, 300: transistor, 500: transistor, 510A: transistor, 510B: transistor, 510C: transistor, 510D: transistor, 510E: transistor, 511: insulator, 512: insulator, 514: insulator, 516: insulator, 520: insulator, 521: insulator, 522: insulator, 524: insulator, 530: oxide, 530$a$: oxide, 530$b$: oxide, 530$c$: oxide, 531: region, 531$a$: region, 531$b$: region, 540$a$: conductor, 540$b$: conductor, 542: conductor, 542$a$: conductor, 542$b$: conductor, 543: region, 543$a$: region, 543$b$: region, 544: insulator, 545: insulator, 546: conductor, 546$a$: conductor, 546$b$: conductor, 547: conductor, 547$a$: conductor, 547$b$: conductor, 550: insulator, 552: metal oxide, 560: conductor, 560$a$: conductor, 560$b$: conductor, 570: insulator, 571: insulator, 573: insulator, 574: insulator, 575: insulator, 576: insulator, 576$a$: insulator, 576$b$: insulator, 580: insulator, 581: insulator, 582: insulator, 584: insulator, 5700: automobile, 5800: electric motorcycle, 5900: microwave oven, 6000: electric refrigerator-freezer, 7000A: IC, 7000B: IC, 7001: lead, 7002: printed circuit board, 7003A: circuit portion, 7003B: circuit portion, 7004: mounting board, 7031: OS transistor layer, 7032: wiring layer, 7033: OS transistor layer

The invention claimed is:

1. A semiconductor device comprising:
a first input terminal and a second input terminal;
a first output terminal and a second output terminal;
a first wiring and a second wiring; and
first to fourth transistors,
wherein one of a source and a drain of the first transistor is electrically connected to the first wiring, one of a gate and a back gate is electrically connected to the first input terminal, and the other of the source and the drain and the other of the gate and the back gate are electrically connected to the second output terminal,
wherein one of a source and a drain of the second transistor is electrically connected to the first wiring, one of a gate and a back gate is electrically connected to the second input terminal, and the other of the source and the drain and the other of the gate and the back gate are electrically connected to the first output terminal,
wherein a gate and a back gate of the third transistor are electrically connected to the first input terminal, one of a source and a drain is electrically connected to the first output terminal, and the other of the source and the drain is electrically connected to the second wiring, and
wherein a gate and a back gate of the fourth transistor are electrically connected to the second input terminal, one of a source and a drain is electrically connected to the second output terminal, and the other of the source and the drain is electrically connected to the second wiring.

2. The semiconductor device according to claim 1, wherein the first to fourth transistors are each a transistor comprising a metal oxide in a channel formation region.

3. The semiconductor device according to claim 2, wherein the metal oxide comprises at least In (indium) or Zn (zinc).

4. The semiconductor device according to claim 3, wherein the metal oxide comprises Ga (gallium).

* * * * *